United States Patent
Lee et al.

(10) Patent No.: US 11,665,818 B2
(45) Date of Patent: May 30, 2023

(54) ELECTRONIC DEVICE INCLUDING FLEXIBLE PRINTED CIRCUIT BOARD LAMINATED WIRELESS CHARGING COIL AND NEAR FIELD COMMUNICATION ANTENNA PATTERN

(71) Applicant: SAMSUNG ELECTRONICS CO., LTD., Suwon-si (KR)

(72) Inventors: Woosup Lee, Suwon-si (KR); Younghoon Kim, Suwon-si (KR); Jungsik Park, Suwon-si (KR); Inkuk Yun, Suwon-si (KR); Sunghyup Lee, Suwon-si (KR); Heeseok Jung, Suwon-si (KR); Sehwan Choi, Suwon-si (KR); Taewook Ham, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 299 days.

(21) Appl. No.: 16/796,041

(22) Filed: Feb. 20, 2020

(65) Prior Publication Data
US 2020/0267834 A1    Aug. 20, 2020

(30) Foreign Application Priority Data

Feb. 20, 2019    (KR) .......................... 10-2019-0020152

(51) Int. Cl.
*H05K 1/02*       (2006.01)
*H01Q 1/24*       (2006.01)
(Continued)

(52) U.S. Cl.
CPC .......... *H05K 1/0277* (2013.01); *H01Q 1/243* (2013.01); *H01Q 1/42* (2013.01); *H02J 7/0042* (2013.01);
(Continued)

(58) Field of Classification Search
CPC .......... H01Q 1/24; H01Q 1/241; H01Q 1/243; H01Q 1/42; H05K 1/0277; H05K 1/0278;
(Continued)

(56) References Cited

U.S. PATENT DOCUMENTS

| 10,003,219 | B1 | 6/2018 | Hidaka et al. |
| 10,269,005 | B2 | 4/2019 | Lee et al. |

(Continued)

FOREIGN PATENT DOCUMENTS

| CN | 107844971 | 3/2018 |
| KR | 10-2016-0129927 | 11/2016 |
| WO | 2018/100975 | 6/2018 |

OTHER PUBLICATIONS

European Search Report and Written Opinion dated Dec. 15, 2021 in corresponding European Application No. 20759355.9.
(Continued)

*Primary Examiner* — Thai Pham
(74) *Attorney, Agent, or Firm* — Nixon & Vanderhye, P.C.

(57) ABSTRACT

An electronic device is disclosed. An electronic device according to various embodiments includes: a housing including a first surface and a second surface disposed to face the first surface and defining an internal space; a battery disposed adjacent to the second surface of the housing; and an antenna module comprising at least one coil disposed to face the first surface on the battery, wherein the antenna module includes: a base; a first wireless charging coil disposed on a surface of the base; a first NFC coil spaced apart from the first wireless charging coil disposed on a surface of the base and disposed outside the first wireless charging coil; a second wireless charging coil disposed at a position corresponding to the first wireless charging coil on an other surface of the base; a second NFC coil disposed at a position corresponding to the first NFC coil on the other
(Continued)

surface of the base and surrounding a partial region of the second wireless charging coil; and a shield sheet disposed under the second wireless charging coil and the second NFC coil, and the antenna module includes a first region in which the second NFC coil and the second wireless charging coil are disposed and a second region corresponding to an other region, and the shield sheet has different thicknesses in the first region and the second region.

19 Claims, 19 Drawing Sheets

(51) Int. Cl.
    *H02J 50/10*    (2016.01)
    *H01Q 1/42*     (2006.01)
    *H05K 5/00*     (2006.01)
    *H02J 7/00*     (2006.01)
    *H02J 7/02*     (2016.01)

(52) U.S. Cl.
    CPC .............. *H02J 7/02* (2013.01); *H02J 50/10* (2016.02); *H05K 1/0203* (2013.01); *H05K 1/0243* (2013.01); *H05K 5/0086* (2013.01)

(58) Field of Classification Search
    CPC .. H05K 1/0212; H05K 1/0243; H05K 5/0086; H02J 50/00; H02J 50/10
    See application file for complete search history.

(56) References Cited

U.S. PATENT DOCUMENTS

| | | | |
|---|---|---|---|
| 2016/0126639 A1 | 5/2016 | Kim et al. | |
| 2016/0336791 A1 | 11/2016 | Na et al. | |
| 2018/0174747 A1* | 6/2018 | Hirobe | H02J 50/12 |
| 2018/0262064 A1* | 9/2018 | Bae | H04B 5/0081 |
| 2018/0331583 A1 | 11/2018 | Kim et al. | |
| 2019/0348203 A1* | 11/2019 | Hirakawa | B32B 25/20 |

OTHER PUBLICATIONS

International Search Report and Written Opinion dated Jun. 15, 2020 in counterpart International Patent Application No. PCT/KR2020/002456.
Office Action dated Jan. 30, 2023 in corresponding Indian Application No. 202117041663 and English-language translation.
Office Action dated Mar. 31, 2023 in Korean Application No. 10-2019-0020152 and English-language translation.

* cited by examiner

ELECTRONIC DEVICE INCLUDING FLEXIBLE PRINTED CIRCUIT BOARD LAMINATED WIRELESS CHARGING COIL AND NEAR FIELD COMMUNICATION ANTENNA PATTERN

CROSS-REFERENCE TO RELATED APPLICATION

This application is based on and claims priority under 35 U.S.C. § 119 to Korean Patent Application No. 10-2019-0020152, filed on Feb. 20, 2019, in the Korean Intellectual Property Office, the disclosure of which is incorporated by reference herein in its entirety.

BACKGROUND

1) Field

The disclosure relates to an electronic device including an FPCB including a wireless charging and NFC antenna.

2) Description of Related Art

Electronic devices with various functions have been introduced with development in electronic communication technology. These electronic devices may include a convergence function that complexly performs one or more functions. Electronic devices include various electronic parts therein and may include a flexible printed circuit board or a flexible cable for connecting electronic parts and a printed circuit board.

As the functional differences among manufacturers are remarkably decreased, electronic devices may be increasingly required to improve a design-related respect and have a compact size in order to satisfy customers' desire for purchase.

It is required to downsize and thin electronic devices in order to easily carry the electronic device and improve aesthetic feeling. A Flexible Printed Circuit Board (FPCB) or a cable electrically connecting various electronic parts and various parts may be included in an electronic device and a plan that can increase efficiency of the internal space of the electronic device is required.

In order to increase efficiency of the internal space, there is a need for a plan that can keep the efficiency of an FPCB antenna structure including a wireless charging coil and an NFC coil and can increase efficiency of a mounting space.

The above information is presented as background information only to assist with an understanding of the disclosure. No determination has been made, and no assertion is made, as to whether any of the above might be applicable as prior art with regard to the disclosure.

SUMMARY

Embodiments of the disclosure are provided to increase the capacity of a battery or usability of the internal space of the electronic device by mounting an additional FPCB or a cable in the space formed by removing the NFC/wireless charging antenna.

An electronic device according to various example embodiments may include: a housing having a first surface and a second surface disposed to face the first surface and defining an internal space; a battery disposed adjacent to the second surface of the housing; and an antenna module comprising at least one coil disposed to face the first surface on the battery. The antenna module may include: a base; a first wireless charging coil disposed on a surface of the base; a first NFC coil spaced apart from the first wireless charging coil disposed on the surface of the base and disposed outside the first wireless charging coil; a second wireless charging coil disposed at a position corresponding to the first wireless charging coil on another surface of the base; a second NFC coil disposed at a position corresponding to the first NFC coil on the another surface of the base and surrounding a partial region of the second wireless charging coil; and a shield sheet disposed under the second wireless charging coil and the second NFC coil. The antenna module has a first region in which the second NFC coil and the second wireless charging coil are disposed and a second region corresponding to an other region, and the shield sheet may have different thicknesses in the first region and the second region.

An electronic device according to various example embodiments may include: a housing having an internal space; a battery disposed in the housing; and an antenna module comprising an antenna disposed on the battery. The antenna module may have a first region having a center portion and a second region corresponding to an edge of the antenna module. The first region and the second region may be provided at different heights from the battery. The antenna module may include: a first wireless charging coil disposed on a surface of a base of the antenna module in the first region; a second wireless charging coil disposed on another surface of the base; and a first NFC coil disposed outside the first wireless charging coil on a surface of the base in the second region.

In the electronic device according to various example embodiments, a step is formed by removing a partial region of an NFC/wireless charging antenna formed by a Flexible Printed Circuit Board (FPCB) including a wireless charging coil and an NFC coil, so a space in which an additional FPCB or a cable can be mounted can be secured.

It is possible to increase the capacity of a battery or usability of the internal space of the electronic device by mounting an additional FPCB or a cable in the space formed by removing the NFC/wireless charging antenna.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
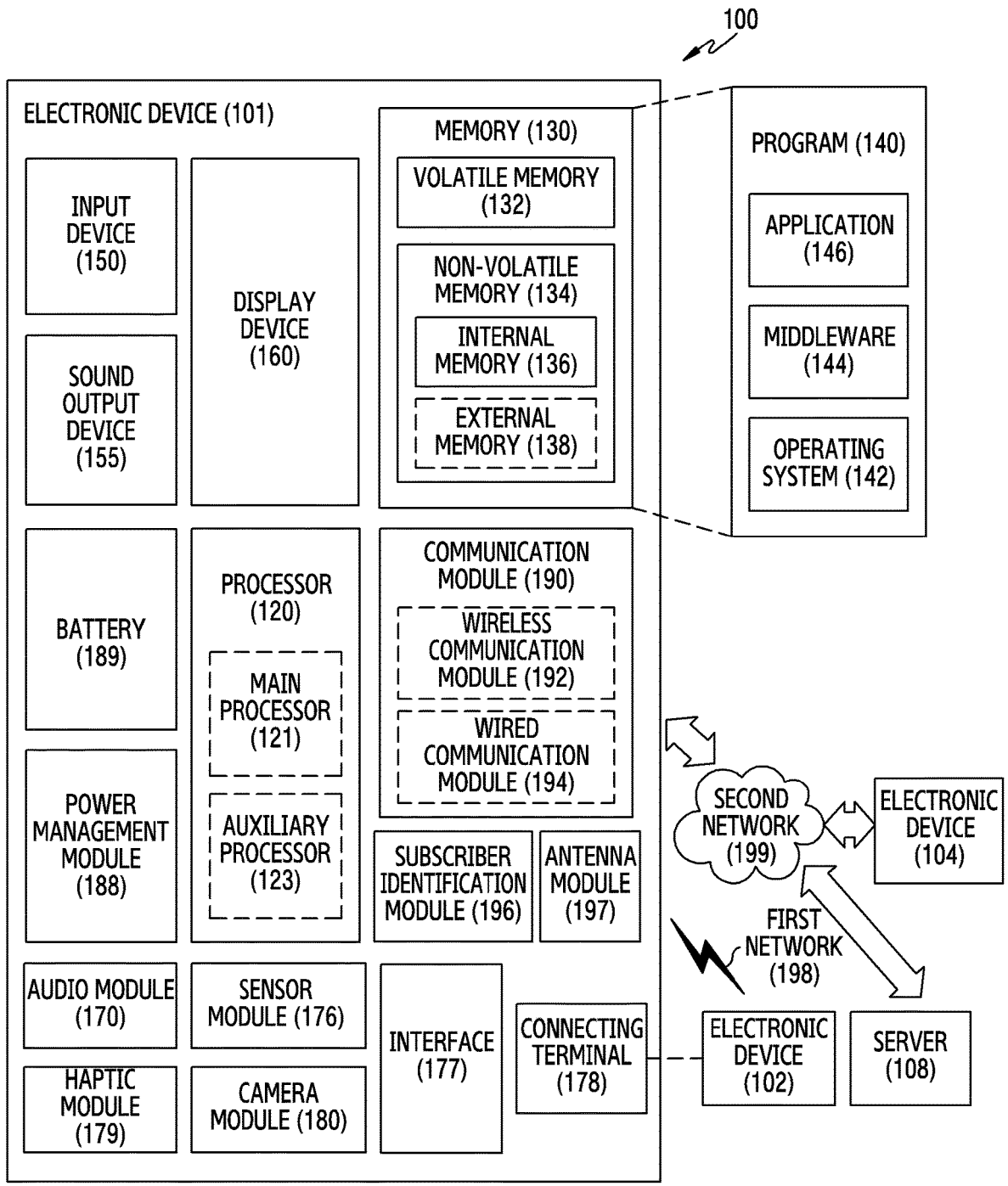
FIG. 1 is a block diagram illustrating an example electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
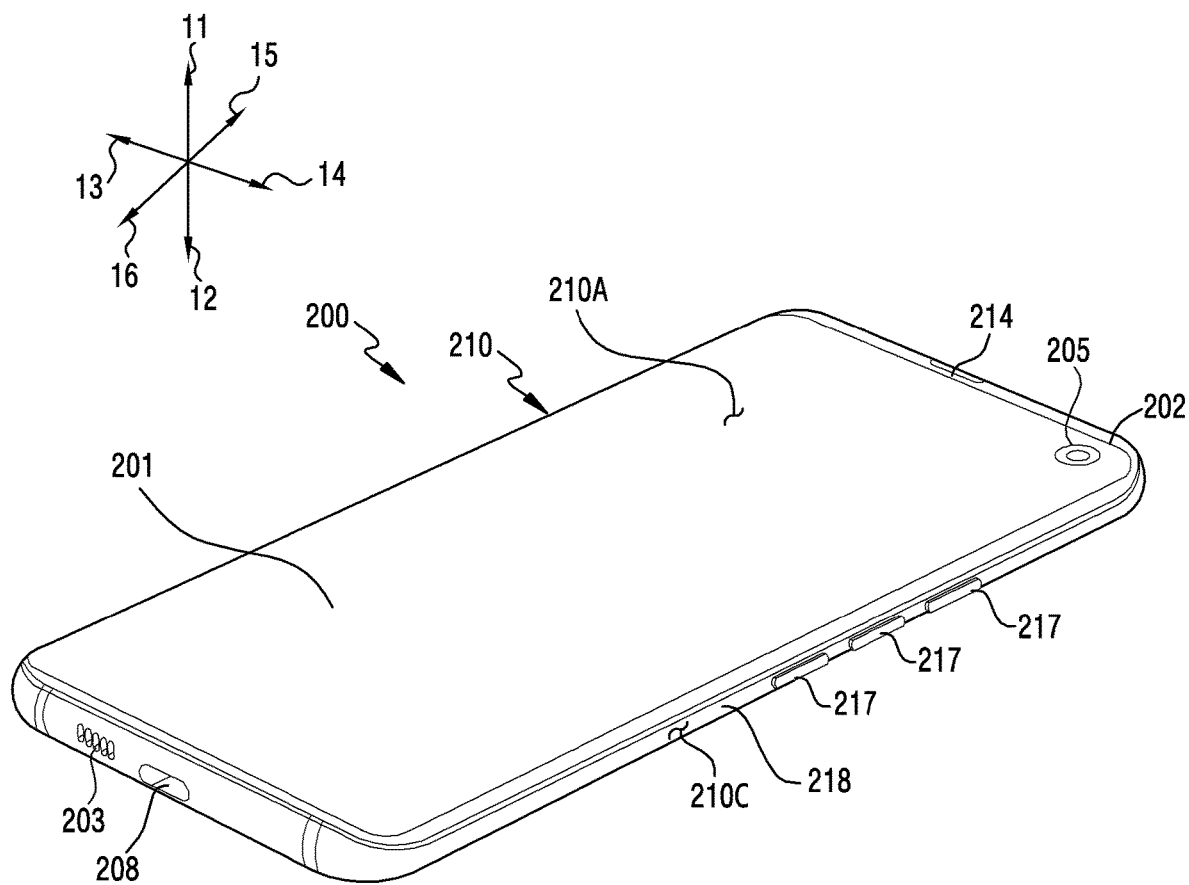
FIG. 2A is a front perspective view illustrating an example electronic device according various embodiments.
Figure 2B:
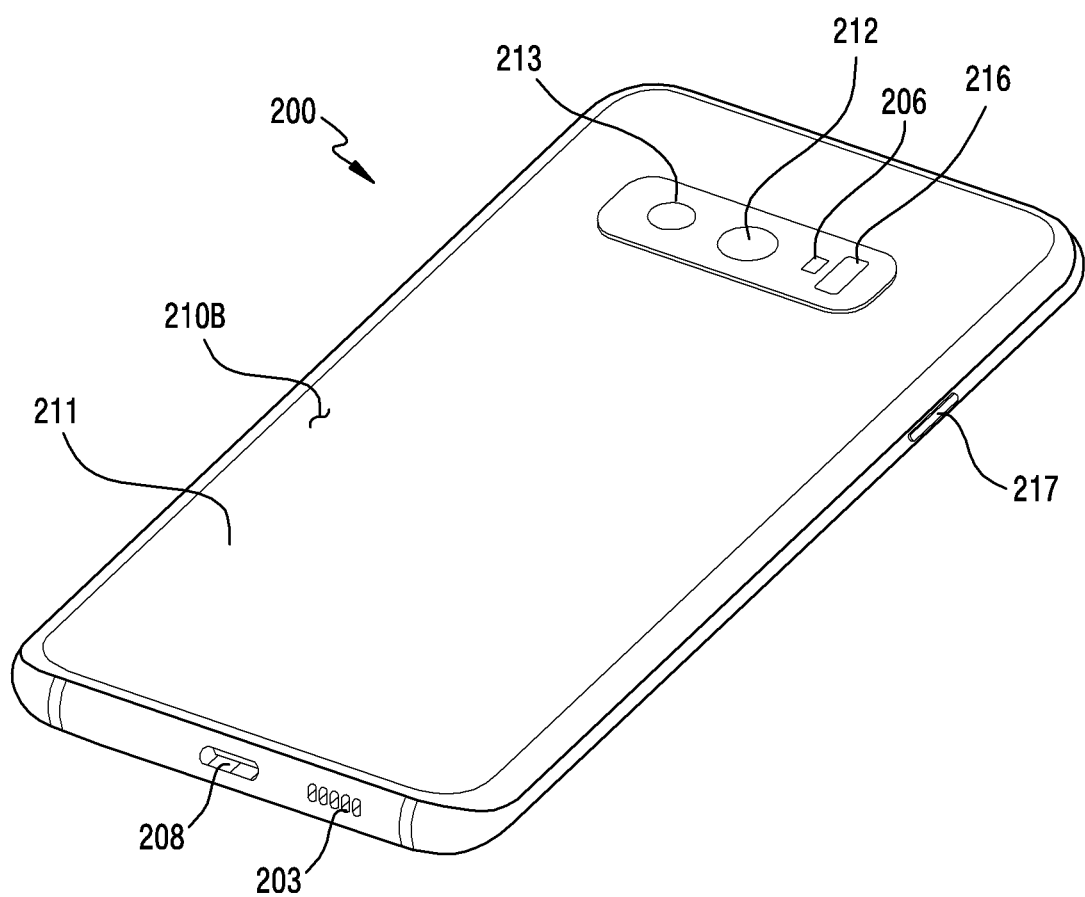
FIG. 2B is a rear perspective view of the example electronic device of FIG. 2A according to various embodiments.

FIG. 2A is a front perspective view illustrating an example electronic device 200 according various embodiments disclosed herein and FIG. 2B is a rear perspective view of the example electronic device 200 of FIG. 2A.

Referring to FIGS. 2A and 2B, an electronic device 200 according to an embodiment may include: a housing 210 including a first face (or a front face) 210A, a second face (or a rear face) 210B, and a side face 210C surrounding the space between the first face 210A and the second face 210B. In another embodiment (not illustrated), the term "housing" may refer to a structure forming some of the first face 210A, the second face 210B, and the side face 210C of FIG. 2A. According to an embodiment, at least a portion of the first face 210A may be formed of a substantially transparent front plate 202 (e.g., a glass plate or a polymer plate including various coating layers).

According to embodiments, the front plate 202 may have a curved portion bending and seamlessly extending from a first surface 210A to a rear plate 211 at least at a side edge portion.

According to embodiments, the second face 210B may be formed of a substantially opaque rear plate 211. The rear plate 211 may be formed of, for example, and without limitation, coated or colored glass, ceramic, a polymer, a metal (e.g., aluminum, stainless steel (STS), or magnesium), or a combination of two or more of these materials.

According to an embodiment, the rear plate 111 may have a curved portion bending and seamlessly extending from the second face 210B to the front plate 102 at least at a side edge portion.

According to various embodiments, the side 210C is combined with a front plate 202 and a rear plate 211 and may be formed by a lateral bezel structure 218 (or a "lateral member or a side wall") including metal and/or a polymer. In an embodiment, the rear plate 211 and the lateral bezel structure 218 may be integrated and may include the same material (e.g., a metallic material such as aluminum).

According to an embodiment, the electronic device 200 may include at least one of a display 201, audio modules 203 and 214, sensor modules, camera modules 205, key input devices 217, and connector holes 208. In some embodiments, in the electronic device 200, at least one of the components (e.g., the key input devices 217) may be omitted, or other components may be additionally included.

For example, an electronic device 200 may include a sensor module not shown. For example, a sensor including a proximity sensor or an illumination sensor may be integrated with a display 201 or may be disposed adjacent to the display 201 in a region that is provided by the front plate 202. In an embodiment, the electronic device 200 may further include a light emitting element and the light emitting element may be disposed adjacent to the display 201 in the region that is provided by the front plate 202. The light emitting element, for example, may provide state information of the electronic device 200 in a light type. In another embodiment, the light emitting element, for example, may provide a light source that operates with the operation of a camera module 205. The light emitting element, for example, may include an LED, an IR LED, and a xenon lamp.

The display 201 may be exposed through, for example, a large portion of the front plate 202. In some embodiments, the edges of the display 201 may be formed to be substantially the same as the contour shape of the front plate 202 adjacent thereto. In another embodiment (not shown), the distance between the outer contour of the display 201 and the outer contour of the front plate 202 may be substantially constant in order to enlarge the exposed area of the display 201.

In another embodiment (not shown), a recess or an opening may be formed in a portion of a display region of the display 201, and other electronic devices aligned with the recess or the opening such as a camera module 205 and a proximity sensor or an illumination sensor (not shown) may be included.

In another embodiment (not shown), at least one of the camera module 212 and 213, the fingerprint sensor 216, and the light-emitting element 206 may be included in the rear face of the screen display area of the display 201. In another embodiment (not shown), the display 201 may be coupled to or disposed adjacent to a touch-sensing circuit, a pressure sensor that is capable of measuring the intensity of the touch (pressure), and/or a digitizer that detects a magnetic-field-type stylus pen.

The audio modules 203 and 214 may include a microphone hole and speaker holes. The microphone hole may include a microphone disposed therein so as to acquire external sound, and in some embodiments, multiple microphones may be disposed therein so as to detect the direction of sound. In some embodiments, the speaker holes and the microphone hole may be implemented as a single hole, or a speaker may be included therein without the speaker holes (e.g., a piezo speaker). The speaker holes may include an external speaker hole and a phone call receiver hole 214.

The electronic device 200 may include a sensor modules (not shown) to generate electrical signals or data values corresponding to the internal operating state or the external environmental state of the electronic device 200. The sensor modules may include, for example, a proximity sensor disposed on the first face 210A of the housing, a fingerprint sensor integrated or adjacent to the display 201, and/or HRM sensor disposed on the second face 210B of the housing 210. The electronic device 100 may further include at least one of sensors (not shown) such as, for example, and without limitation, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, an illuminance sensor, or the like.

The camera modules 205, 212, 213, and 206 may include a first camera device 205 disposed on the first face 210A of the electronic device 200 and a second camera device 212 and 213 disposed on the second face 210B, and/or a flash 206. The camera devices 205, 212 and 213 may include one or more lenses, an image sensor, and/or an image signal processor. The flash 206 may include, for example, a light-emitting diode or a xenon lamp. In some embodiments, two or more lenses (e.g., an infrared camera lens, a wide-angle lens, and a telephoto lens) and image sensors may be disposed on one face of the electronic device 200.

The key input devices 217 may be disposed on the side faces 210C of the housing 210. In another embodiment, the electronic device 200 may not include some or all of the above-mentioned key input devices 217, and a key input device 217, which is not included therein, may be implemented in another form, such as that of a soft key or the like on the display 201. In some embodiments, the key input devices may include a sensor module 216 disposed on the second face 210B of the housing 210.

The connector holes 208 may be capable of accommodating a connector for transmitting and receiving power and/or data to and from an external electronic device, and/or a connector for transmitting and receiving an audio signal to and from an external electronic device. For example, the connector holes 208 may include USB connector or earphone jack.

Figure 3:
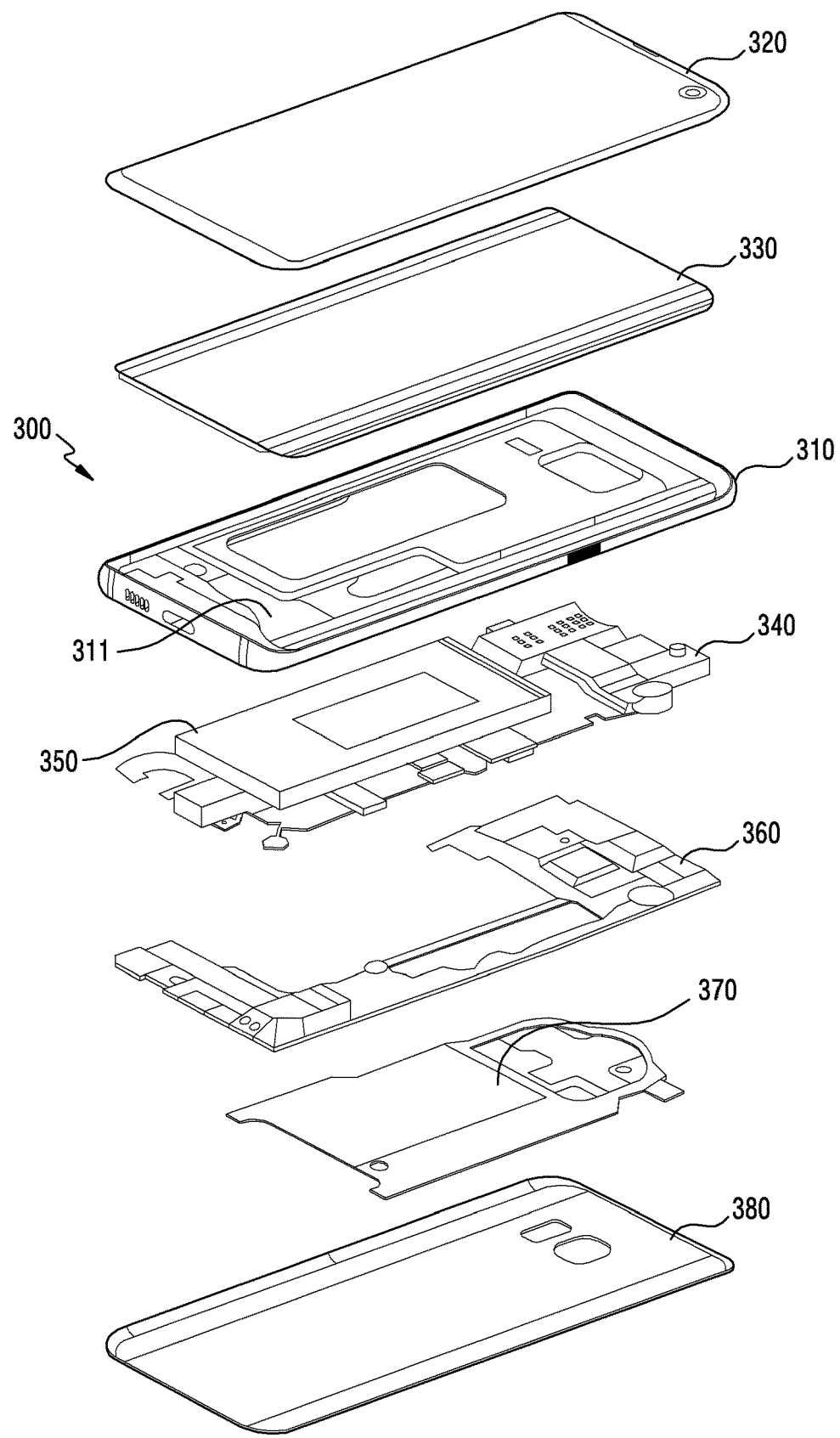
FIG. 3 is an exploded perspective view of the example electronic device of FIG. 2A according to various embodiments.

FIG. 3 is an exploded perspective view of the example electronic device of FIG. 2A according to various embodiments.

Referring to FIG. 3, an electronic device 300 may include a side bezel structure 310, a first support member 311 (e.g., a bracket), a front plate 320, a display 330, a PCB 340, a battery 350, a second support member 360 (e.g., a rear case), an antenna 370, and a rear plate 380. In some embodiments, at least one of the components (e.g., the first support member 311 or the second support member 360) may be omitted from the electronic device 300, or the electronic device 300 may additionally include other components. At least one of the components of the electronic device 300 may be the same as or similar to at least one of the components of the electronic device 200 of FIG. 1 or FIGS. 2A and 2B, and a redundant description may not be repeated here.

The first support member 311 may be disposed inside the electronic device 300 and may be connected to the side bezel structure 310, or may be formed integrally with the side bezel structure 310. The first support member 311 may include, for example, a metal material and/or a non-metal (e.g., polymer) material. The display 330 may be coupled to one face of the first support member 311, and the PCB 340 may be coupled to the other face of the first support member 332. On the PCB 340, a processor, a memory, and/or an interface, or the like, may be mounted. The processor may include various processing circuitry including at least one of, for example, and without limitation, a central processing unit, an application processor, a graphic processor, an image signal processor, a sensor hub processor, a communication processor, or the like.

The memory may include, for example, volatile memory and/or nonvolatile memory.

The interface may include, for example, and without limitation, a high-definition multimedia interface (HDMI), a universal serial bus (USB) interface, an SD card interface, and/or an audio interface, or the like. The interface may electrically or physically connect, for example, the electronic device 300 to an external electronic device, and may include, for example, and without limitation, a USB connector, an SD card/an MMC connector, an audio connector, or the like.

The battery 350 is a device for supplying power to at least one component of the electronic device 300, and may include, for example, and without limitation, a non-rechargeable primary battery, a rechargeable secondary battery, a fuel cell, or the like. At least a portion of the battery 350 may be disposed to be substantially flush with, for example, the PCB 340. The battery 350 may be integrally disposed within the electronic device 300, or may be detachably mounted on the electronic device 300.

The antenna 370 may be disposed between the rear plate 380 and the display 350. The antenna 370 may include, for example, and without limitation, a near-field communication (NFC) antenna, a wireless charging antenna, and/or a magnetic secure transmission (MST) antenna, or the like. The antenna 370 may perform short-range communication with, for example, an external electronic device, or may transmit/receive power required for charging to/from the external device in a wireless manner. In another embodiment, an antenna structure may be formed by the side bezel structure 310, a portion of the first support member 311, or a combination thereof.

Figure 4A:
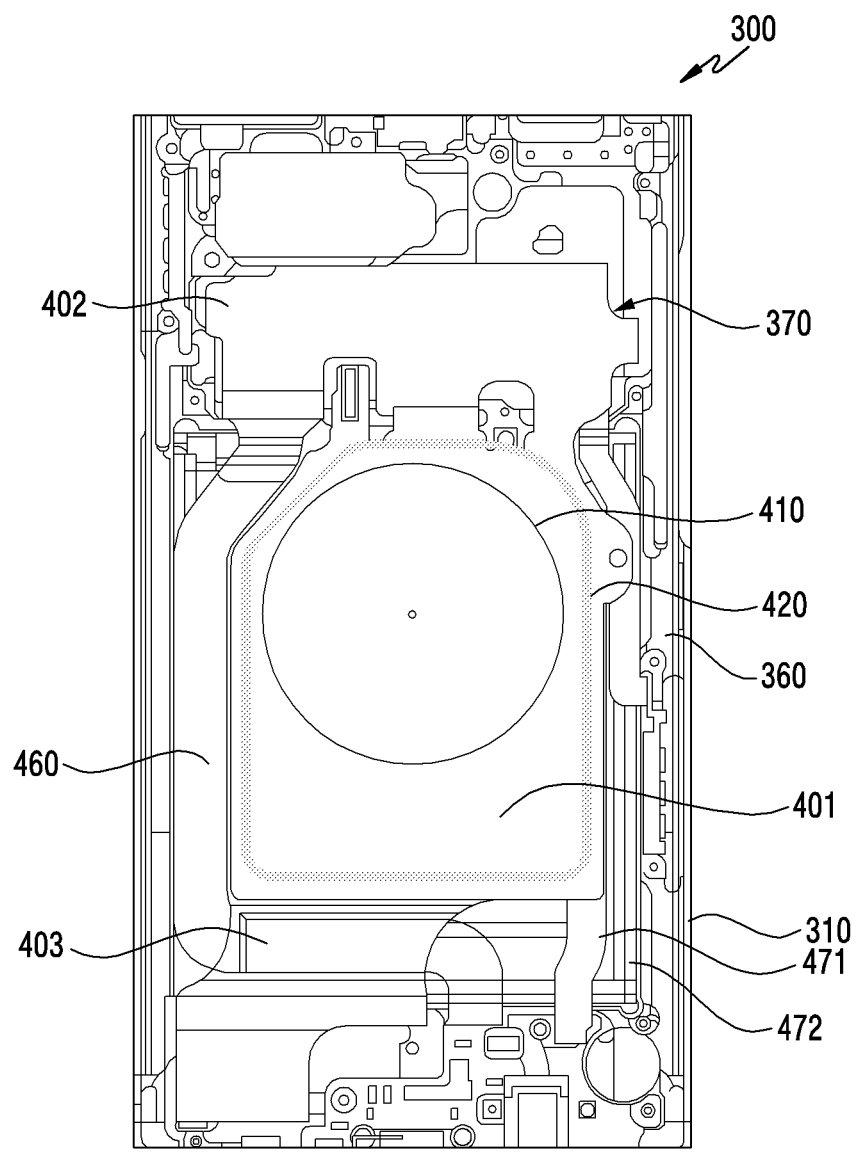
FIG. 4A is a diagram illustrating an example electronic device mounted with an NFC/wireless charging antenna according to various embodiments.
Figure 4B:
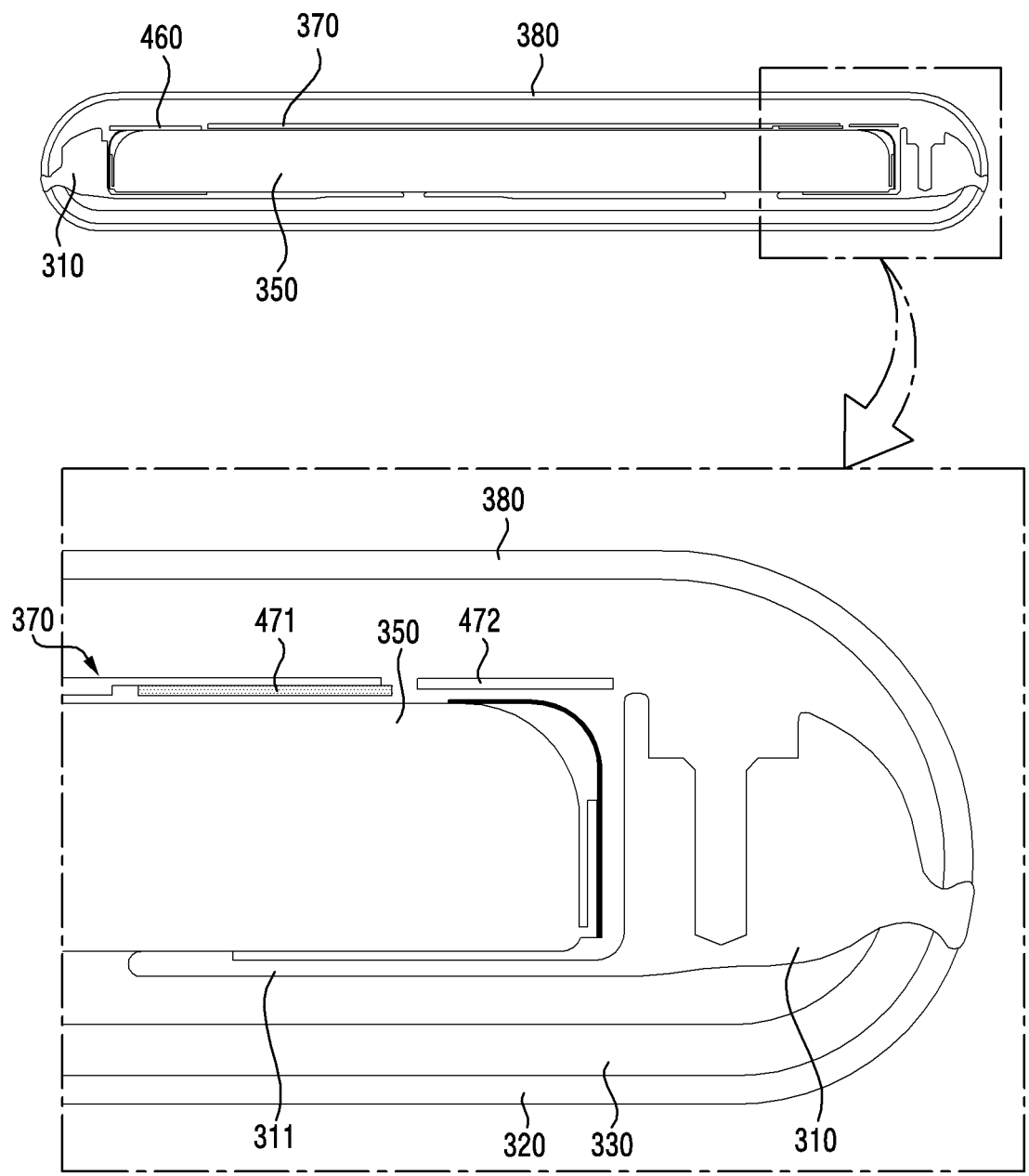
FIG. 4B is a cross-sectional view illustrating the example electronic device including an NFC/wireless charging antenna of FIG. 4A according to various embodiments.

FIG. 4A is a diagram illustrating an example electronic device mounted with an antenna module according to various embodiments and FIG. 4B is a cross-sectional view of the electronic device including an antenna module of FIG. 4A according to various embodiments.

Referring to FIGS. 4A and 4B, an electronic device 300 may include an antenna module 370 (e.g., an antenna 370 of FIG. 3), a battery 350, a rear plate 380, and a front plate 320. The front plate 320 (e.g., the front plate 320 in FIG. 3), the rear plate 380 (e.g., the rear plate 380 in FIG. 3), and the side member 310 (e.g., the side member 310 in FIG. 3) can form a housing. A display 330 may be attached to a surface of the front plate 320. The side member 310 may include a first support member 311 extending into the housing. The first support member 311 can support a battery 350 and an antenna module 370 may be disposed on a surface of the battery 350.

According to various embodiments, the antenna module 370 may include a wireless charging coil 410 and an NFC coil 420. The antenna module 370 may be formed in a first region 401 in which the wireless charging coil 410 and the NFC coil 420 are disposed and a second region 402 extending from the first region 401 and attached to a second support member 360 (e.g., the second support member 360 in FIG. 3 (e.g., a rear case)), and may extend from the first region 410 while facing the second region 402 with the first region 401 therebetween, and may be attached to a portion of the second support member 360.

The first region 401 may include the wireless charging coil 410 and/or the NFC coil 420 therein, a portion of the first region 401 may have a groove, and at least one of a first flexible printed circuit board 460, a second flexible printed circuit board 471, or a third flexible printed circuit board 472 may be disposed in the groove formed in the first region 401. According to various embodiments, the second region 402 and the third region 403 of the antenna module 370 may be formed integrally with a heat dissipater attached to the first region 401. According to various embodiments, the first region 401 of the antenna module 370 may be attached to the rear plate 380 of the housing and the third region 403 may be attached to a speaker housing.

According to various embodiments, a battery (e.g., the battery 350 in FIG. 3) may be disposed in a region formed between the first flexible printed circuit board 460, the second flexible printed circuit board 471, or the third flexible printed circuit board 472 and the first support member 311. The battery 350 may overlap at least one of the first flexible printed circuit board 460, the second flexible printed circuit board 471, or the third flexible printed circuit board 472. For example, the battery 350 may be disposed between a surface on which the first flexible printed circuit board 460, the second flexible printed circuit board 471, and the third flexible printed circuit board 472 are formed and the first support member 311. Alternatively, the battery 350 may be disposed between a surface on which the first flexible printed circuit board 460 and the second flexible printed circuit board 471 are formed and the first support member 311. Alternatively, the battery 350 may be disposed between a surface on which one of the first flexible printed circuit board 460, the second flexible printed circuit board 471, or the third flexible printed circuit board 472 is formed and the first support member 311.

Figure 5:
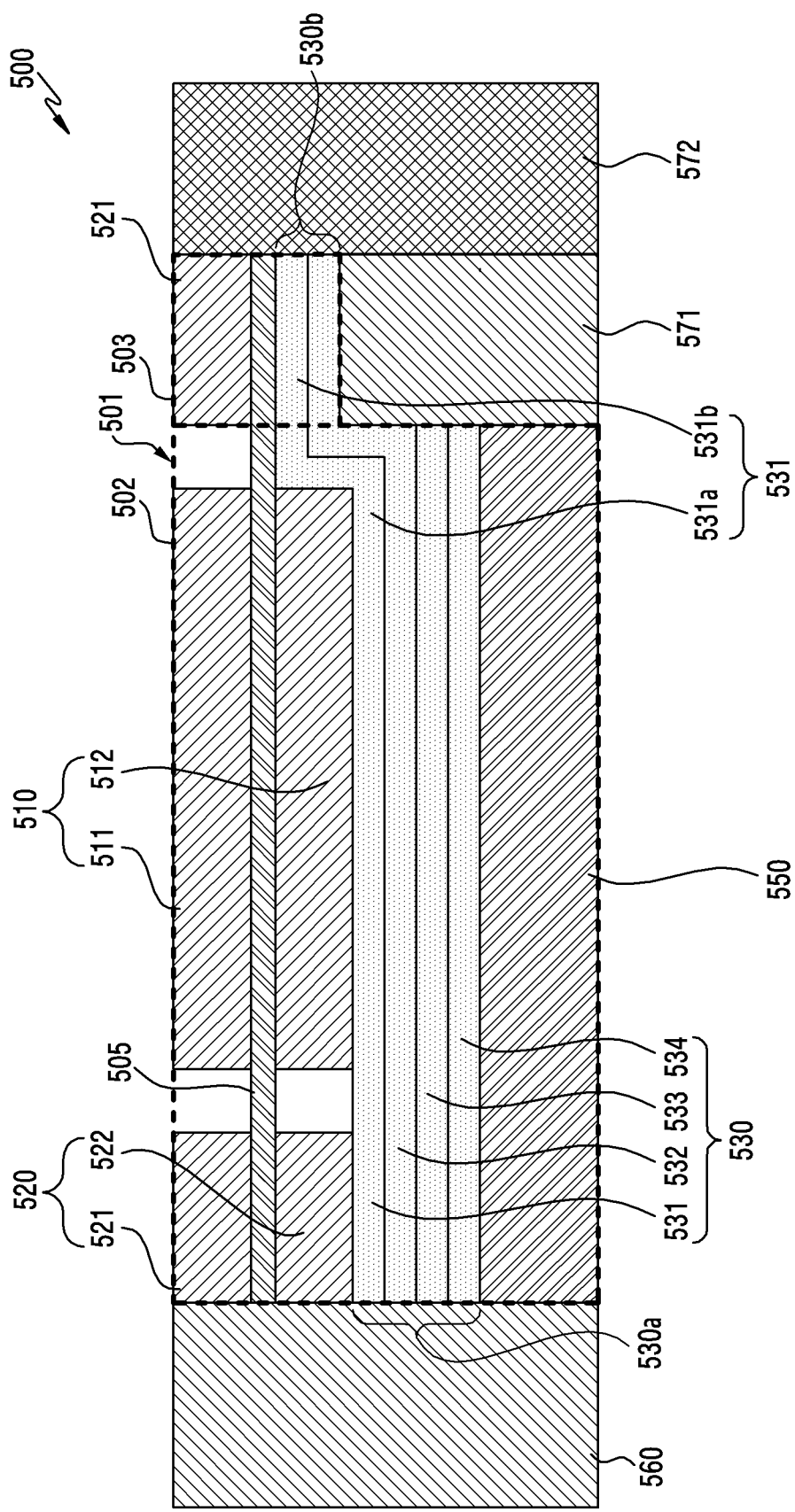
FIG. 5 is a cross-sectional view illustrating an example NFC/wireless charging antenna according to various embodiments.

FIG. 5 is a cross-sectional view illustrating an example antenna module according to various embodiments.

Referring to FIG. 5, an electronic device 500 may include an antenna module 501, a first flexible printed circuit board 560, second flexible printed circuit board 571, and third flexible printed circuit board 572 that is disposed adjacent to the antenna module 501.

A base 505 on which patterns of a wireless charging coil 510 and an NFC coil 520 are stacked, a magnetic substance or material 530 disposed under the base 505 and preventing and/or reducing a magnetic field generated by a current flowing in the wireless charging coil 510 and the NFC coil 520 from being offset by electronic parts mounted in the electronic device, a heat dissipater 550 disposed under the magnetic substance 530 and dissipating heat, and a battery (e.g., the battery 350 in FIG. 3) disposed under the heat dissipater 550 may be disposed in the antenna module 501. The NFC coil 520 and the wireless charging coil 510 can transmit/receive signals at different frequency bands.

According to an embodiment, the base 505 is formed in a plate shape, and the wireless charging coil 510 and the NFC coil 520 may be patterned on the outer surface of the base 505. The base 505 may be a substrate made of a flexible material. For example, the base 505 may include polyimide (PI) that is used as a base material of a flexible printed circuit board. The magnetic substance 530 can minimize and/or reduce influence on the magnetic field, which is generated by a current flowing in the wireless charging coil 510 and the NFC coil 520, by various electronic parts disposed on a coil rear surface. For example, the magnetic substance 530 can prevent and/or reduce the battery, the printed circuit board, or the support member disposed on the surface on which the magnetic substance is positioned from offsetting the magnetic field generated by the wireless charging coil 510 or the NFC coil 520. The magnetic field generated by the wireless charging coil 510 and the NFC coil 520 may concentrate in the opposite direction to the magnetic substance 530. The magnetic substance 530 can concentrate the magnetic field generated by the wireless charging coil 510 to the surface on which the rear plate (e.g., the rear plate 380 in FIG. 3) of the housing is disposed, thereby being able to increase the charging efficiency of the battery. Since a magnetic field from the NFC coil 520 can be concentrated to the rear plate by the magnetic substance 530, the NFC coil 520 can perform Near Field Communication (NFC) with an external electronic device (e.g., the electronic device 102 in FIG. 1). The NFC coil 520 can communicate with an external device and an electronic device can exchange data with the external device at a near field.

According to an embodiment, the wireless charging coil 510 may include a first wireless charging coil 511 and/or a second wireless charging coil 512 that are wound on the top and bottom surfaces of the base 505. The wireless charging coil 510 may include a material having conductivity. For example, the wireless charging coil 510 may include copper (Cu). The wireless charging coil 510 may be patterned on both surfaces of the base 505 to be wound in parallel around the top and bottom surface of the base 505. The wireless charging coil 510 may include the first wireless charging coil 511 disposed over the base 505 and the second wireless charging coil 512 disposed under the base 505. The thicknesses of the first wireless charging coil 511 and the second wireless charging coil 512 may be substantially the same, but are not limited thereto. In the embodiments of FIGS. 8A, 8B, 11, 12, and 13 to be described in greater detail below, the thicknesses of the first wireless charging coil 511 and the second wireless charging coil 512 may be different. The first wireless charging coil 511 and the second wireless charging coil 512 can be electrically connected to each other through a conductive via disposed in a via hole (not shown) formed in the base 505. The wireless charging coil 510 may be one continuous coil of the first wireless charging coil 511 and the second wireless charging coil 512 through the conductive via.

According to an embodiment, the NFC coil 520 may include a first NFC coil 521 patterned on the top surface of the base 505 and/or a second NFC coil 522 patterned on the bottom surface of the base 505. The first NFC coil 521 may be disposed outside the first wireless charging coil 511 on the top surface of the base 505. The first wireless charging coil 511 may be disposed inside the first NFC coil 521 on the top surface of the base 505. The first NFC coil 521 and the first wireless charging coil 511 may be spaced apart from each other. For example, the first NFC coil 521 may be disposed on the top surface of the base 505 to surround the first wireless charging coil 511.

The second NFC coil 522 may be disposed outside the second wireless charging coil 512 on the bottom surface of the base 505. The second wireless charging coil 512 may be disposed inside the second NFC coil 522 on the bottom surface of the base 505. The second NFC coil 522 and the second wireless charging coil 512 may be spaced apart from each other. For example, the second NFC coil 522 may be disposed on the bottom surface of the base 505 to surround the second wireless charging coil 512.

According to various embodiments, the first NFC coil 521 and the second NFC coil 522 can be electrically connected to each other by a conductive via formed in a via hole of the base 505. The NFC coil 520 may be one continuous coil of the first NFC coil 521 and the second NFC coil 522 through the conductive via.

The antenna module 501 may be divided into a first region 502 in which the wireless charging coil and the NFC coil 520 are disposed on both of the top and bottom surfaces and a second region 503 in which at least a portion of the second NFC coil 522 disposed on the bottom surface of the base is removed.

According to various embodiments, in the second region 503, the NFC coil 520 may include the first NFC coil 521 and the second NFC coil 522 may be removed. In the first region 502, the second NFC coil 522 may be formed to surround a portion of the second wireless charging coil 512 and the second region 503 may be removed or may not be patterned. The second wireless charging coil 512 is not disposed in the second region 503, the first region 502 and the second region 503 may have different heights from the battery. In the second region 503, a space corresponding to the thickness of the second wireless charging coil 512 can be secured, so the second flexible printed circuit board 571 can be disposed in the space between the antenna module 501 and the battery.

The magnetic substance 530 may be disposed under the wireless charging coil 510 in the first region and may be disposed under the base 505 in the second region. The magnetic substance 530 can turn the magnetic field formed by the wireless charging coil 510 or the NFC coil 520 in the opposite direction to the magnetic substance. A plurality of magnetic substances 530 may be disposed in layers. The thickness of the magnetic substance 530 may be different, depending on their positions, and the disposed shape may also be different.

According to an embodiment, the magnetic substance 530 may include a first magnetic substance 531 positioned in the first region and the second region and a second magnetic substance 532 disposed under the first magnetic substance 531. The magnetic substance 530 may include a third magnetic substance 533 disposed under the second magnetic substance 532 in the first region 503 and a fourth magnetic substance 534 disposed under the third magnetic substance 533. The magnetic substance 530 may include only the first magnetic substance 531 and the second magnetic substance 531 in the second region 503 in which the second NFC coil 522 is removed, and may include the first magnetic substance 531, the second magnetic substance 532, the third magnetic substance 533, and a fourth magnetic substance 534 in the first region 502 in which the second wireless charging coil 512 and the second NFC coil 522 are not removed. The magnetic substance may be divided into a magnetic substance 530a disposed in the first region 502 and a magnetic substance 530b disposed in the second region. The magnetic substance 530a disposed in the first region 502 may be thicker than the magnetic substance 530b disposed in the second region.

The first magnetic substance 531 and the second magnetic substance 532 can prevent and/or reduce influence by electronic parts that offset the magnetic field formed by the NFC coil 520 and the wireless charging coil 510. The third magnetic substance 533 and the fourth magnetic substance 534 can offset the magnetic field formed by the wireless charging coil 510. The first magnetic substance 531, the second magnetic substance 532, the third magnetic substance 533, and the fourth magnetic substance 534 concentrate the magnetic fields generated by the NFC coil 520 and the wireless charging coil 510, thereby being able to improve the wireless charging efficiency and the NFC antenna performance.

According to an embodiment, the first magnetic substance 531, the second magnetic substance 532, the third magnetic substance 533, and the fourth magnetic substance 534 may be made of the same material. The first magnetic substance 531, the second magnetic substance 532, the third magnetic substance 533, and the fourth magnetic substance 534 may be formed as layers having substantially the same thickness. The first magnetic substance 531, the second magnetic substance 532, the third magnetic substance 533, and the fourth magnetic substance 534 may be made of a material having high magnetic permeability and a low loss tangent in the bands of the NFC coil 520 and the wireless charging coil 510. The first magnetic substance 531, the second magnetic substance 532, the third magnetic substance 533, and the fourth magnetic substance 534 may include a material having fine crystals and may have high magnetic permeability and a low loss tangent in the bands of about 10 Khz to 15 Mhz of the wireless charging coil 510 and the NFC coil 520. The magnetic substance 530 can be used as a strong magnetic substance in the band of about 10 Khz to 15 Mhz of the wireless charging coil 510 and the NFC coil 520, so it can minimize and/or reduce the influence by electronic parts disposed around the NFC/wireless charging antenna module 501, whereby it is possible to improve the performance of the wireless charging coil 510 and the NFC coil 520.

According to an embodiment, the first magnetic substance 531 may have a first portion 531a disposed in the first region 502 and a second portion 531b disposed at the first portion 531a in the second region 503. The first portion 531a and the second portion 531b may be disposed substantially in parallel. The first portion 531a and the second portion 531b of the first magnetic substance 530 may be different in height from the battery 550. The magnetic substance 530 may be formed by connecting the first portion 531a and the second portion 531b. For example, as shown in FIG. 5, the first portion 531a and the second portion 531b can be connected, and the boundary may be smoothly connected instead of the bending shape shown in FIG. 5. The first portion 531a of the first magnetic substance 531 may be disposed in contact with the second NFC coil 522 and the second wireless charging coil 512 in the first area 502. The second portion 531b of the first magnetic substance 531 may be formed in contact with the base 505. The first portion 531a may bend between the first portion 531a and the second portion 531b (e.g., around the boundary of the first region 502 and the second region 503) and may extend along the side of the second wireless charging coil 512. The first magnetic substance 531 may bend at least twice or more.

According to various embodiments, the second magnetic substance 532 may have the same shape as the first magnetic substance 531 between the first region 502 and the second region 503. According to various embodiments, the second magnetic substance 532 may be smoothly connected between the first region 502 and the second region. The second magnetic substance 532 may be disposed to face the base 505 with the first magnetic substance 531 therebetween.

According to an embodiment, the third magnetic substance 533 and the fourth magnetic substance 534 may be disposed under the second magnetic substance 532. The third magnetic substance 533 and the fourth magnetic substance 534 may be disposed at positions corresponding to the first portion 531a of the first magnetic substance 531. The third magnetic substance 533 and the fourth magnetic substance 534 may be disposed at the position where a portion of the NFC coil 520 and the wireless charging coil 510 are positioned. For example, the third magnetic substance 533 and the fourth magnetic substance 534 may be disposed under the second magnetic substance in the first region 502 in which the wireless charging coil 510 and the second NFC coil 522 are disposed. The third magnetic substance 533 and the fourth magnetic substance 534 may overlap at least a portion of the NFC coil 520 and the wireless charging coil 510 are positioned.

According to an embodiment, the heat dissipater 550 may be disposed under the magnetic substance 530. The heat dissipater 550 may be formed as one layer, but is not limited thereto and may be formed as a plurality of layers. A plurality of layers forming the heat dissipater 550 may have the same thickness and at least one of the plurality of layers may have a different thickness. The heat dissipater 550 may be made of a metal material. The heat dissipater 550 can discharge heat generated from the wireless charging coil 510 or the NFC coil 520 and transferring through the magnetic substance 530 or the base 505. The heat dissipater 550 may be thick such that it can sufficiently dissipate heat generated by the wireless charging coil 510. The heat dissipater 550 may be disposed to overlap the third magnetic substance 533 and the fourth magnetic substance 534. The heat dissipater 550 may be disposed to overlap at least a portion of the wireless charging coil 510. The heat dissipater 550 may include graphite having excellent heat dissipation ability to reduce heat generated by the wireless charging coil 510 or the battery, and may be a heat dissipation plate including a heat sink or a heat pipe.

The first flexible printed circuit board 560 (e.g., the first flexible printed circuit board 460 in FIG. 4A) may be disposed at a side formed by the first magnetic substance 531, the second magnetic substance 532, the third magnetic substance 533, the fourth magnetic substance 534, the first NFC coil 521, and the second NFC coil 522. For example, the first flexible printed circuit board 560 may be in contact with a side of the first region 502 of the antenna module 501. As another example, the magnetic substance 530 and the heat dissipater 550 are stacked at a lower portion in the region in which the first NFC coil 521 and the second NFC coil 522 are formed on both surface of the base 505, so the first flexible printed circuit board 560 may be disposed on a side of the NFC/wireless charging antenna 501.

According to an embodiment, the second flexible printed circuit board 571 may be disposed under the second magnetic substance 532 in the second region 503 of the antenna module 501 in which the second NFC coil 522 is removed. The second region 503 of the antenna module 501 may be thinner than the first region 502. For example, the second region 503 of the antenna module 501 is formed thin to correspond to the thickness of the second NFC coil 522, so it may have a space in which the second NFC coil 522 is removed. In the second region 503 of the NFC/wireless charging antenna 501, a space is formed toward the base 505 by the second NFC coil 522, and the third magnetic substance 533 and the fourth magnetic substance 534 are moved, so it is possible to secure a space in which the second flexible printed circuit board 571 (e.g., the second flexible printed circuit board 471 in FIG. 4A) is disposed. The second flexible printed circuit board 571 may be disposed in the second region of the antenna module 501 in contact with the side formed by the third magnetic substance 533, the fourth magnetic substance 534, and the heat dissipater 550. The second flexible printed circuit board 571 may be disposed in the second magnetic substance 332 disposed in the second region and may be disposed to overlap the first NFC coil 521 disposed in the second region 503.

Figure 6A:
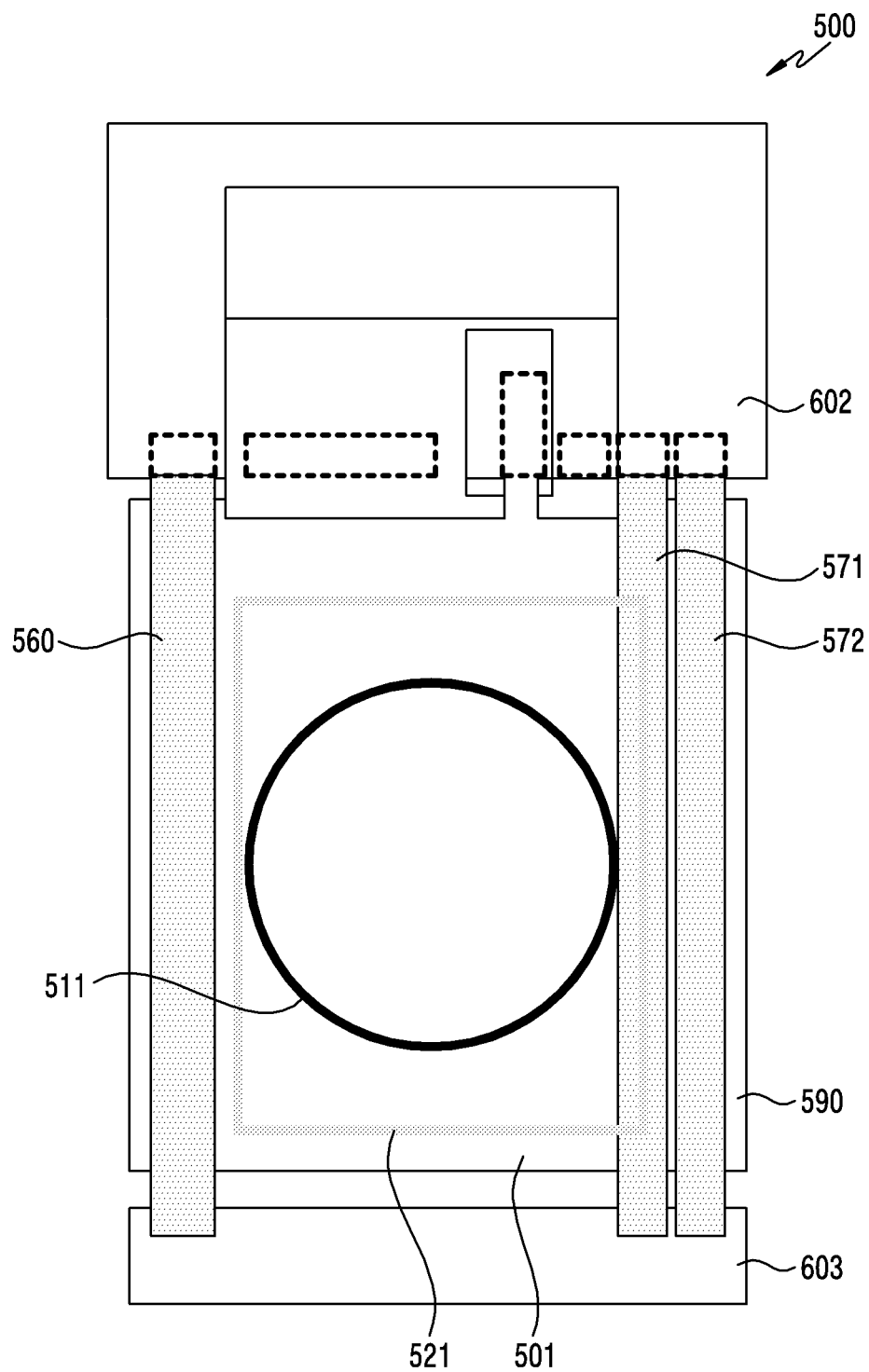
FIG. 6A is a plan view of the example NFC/wireless charging antenna of FIG. 5 according to various embodiments.
Figure 6B:
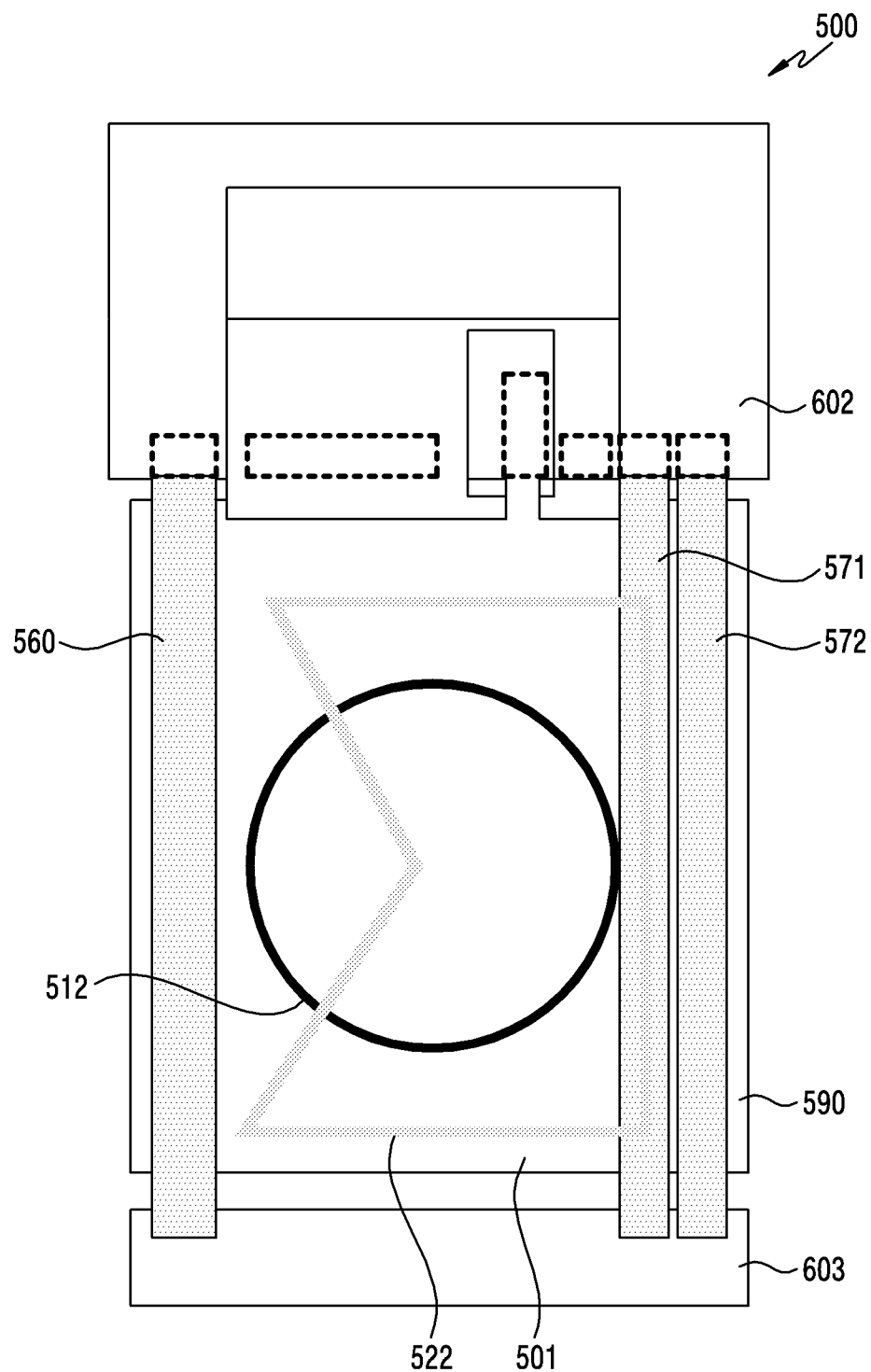
FIG. 6B is a plan view of the example NFC/wireless charging antenna of FIG. 5 according to various embodiments.

FIG. 6A is a plan view illustrating an example substrate including coils included in an electronic device according to various embodiments and FIG. 6B is a plan view illustrating an example substrate including coils included in an electronic device according to various embodiments.

Referring to FIGS. 6A and 6B, an electronic device may include a first flexible printed circuit board 602, a second flexible printed circuit board 603, a battery 590, and one or more Flexible Printed Circuit Boards (FPCB) 560, 571, and 572.

The first flexible printed circuit board 602 may be a main printed circuit board. One or more electronic parts may be mounted on the first flexible printed circuit board 602. For example, a processor (e.g., the process 120 in FIG. 1), a memory (the memory 130 in FIG. 1), etc. may be mounted on the first flexible printed circuit board 602. The electronic parts disposed on the first flexible printed circuit board 602 can be operated to control the operation of the electronic device.

The second flexible printed circuit board 603 may be a sub-printed circuit board. The second flexible printed circuit board 603 may be electrically connected to the first flexible printed circuit board 602. One or more electronic parts may be mounted on the second flexible printed circuit board 603. For example, the second flexible printed circuit board 603 may include the a contact or switch, a sound output device, an input device, or various connection terminals (e.g., the connection terminal 178 in FIG. 1) that accesses a communication module (e.g., the communication model 190 in FIG. 1) through an antenna. For example, the connection terminals may be connected to an external device (e.g., the electronic device 102 in FIG. 1) such as a headphone, a power supply device, or a storage device. The second flexible printed circuit board 603 may be spaced apart from the first flexible printed circuit board 602. The second flexible printed circuit board 603 can control the operation of the electronic device in cooperation with the first flexible printed circuit board 602.

The battery 590 may be disposed between the first flexible printed circuit board 602 and the second flexible printed circuit board 603. The battery 590 can provide power to the electronic parts in the electronic device. The battery 590 can provide power to the first flexible printed circuit board 602 or the second flexible printed circuit board 603. The battery 590 may be spaced apart from the first flexible printed circuit board 602 and the second flexible printed circuit board 603. As a modified example, the flexible printed circuit boards 560, 571, and 572 may be disposed on a surface of the battery 590. The flexible printed circuit boards 560, 571, and 572 may be made of a flexible material. For example, the base flexible printed circuit boards 560, 571, and 572 may include polyimide (PI).

The first flexible printed circuit board 560 may be a substrate electrically connecting the first printed circuit board 602 and the second printed circuit board 603. The first flexible printed circuit board 560 may include a plurality of signal lines and power lines. For example, the first flexible printed circuit board may include signal lines for exchanging data through connection with an external device or sound lines for transmitting signals from various sound devices connected through the connection terminals to the processor. The first flexible printed circuit board 560 may include a power line for supplying power supplied from an external power device to the parts of the electronic device.

The second flexible printed circuit board 571 and/or the third flexible printed circuit board 572 may be an RF transmission line for transmitting/receiving an RF communication signal. The second flexible printed circuit board 571 and/or the third flexible printed circuit board 572 can transmit/receive radio waves of a frequency higher than that of the first flexible printed circuit board 560. The second flexible printed circuit board 571 and/or the third flexible printed circuit board 572 can electrically connect the first flexible printed circuit board 602 and the second printed circuit board 603. The second flexible printed circuit board 571 and/or the third flexible printed circuit board 572 can transmit/receive control commands between the first flexible printed circuit board 602 and the second printed circuit board 603. The second flexible printed circuit board 571 and/or the third flexible printed circuit board 572 may be spaced apart from each other or may be disposed to partially overlap each other.

According to various embodiments, the antenna module 501 may include a wireless charging coil 511 and an NFC coil 521. The antenna module 501 may overlap the first flexible printed circuit board 560, the second flexible printed circuit board 571, or the third flexible printed circuit board 572. The antenna module 501 has a mounting space for disposing the first flexible printed circuit board 560 or the second flexible printed circuit board 571.

According to various embodiments, the wireless charging coil 511 and the NFC coil 521 each may be formed in two layers. The wireless charging coils 511 in the layers may be formed in the same shape and the NFC coils 521 in the layers may be formed in the same shape. When the NFC coils 521 are formed in the same shapes in the layers, the NFC coils 521 may be formed only on a surface and may be removed on the other surface in the region in which the first flexible printed circuit board 560, the second flexible printed circuit board 571, or the third flexible printed circuit board 572 are mounted in order to secure a space in which the first flexible printed circuit board 560, the second flexible printed circuit board 571, or the third flexible printed circuit board 572 are mounted.

Figure 7:
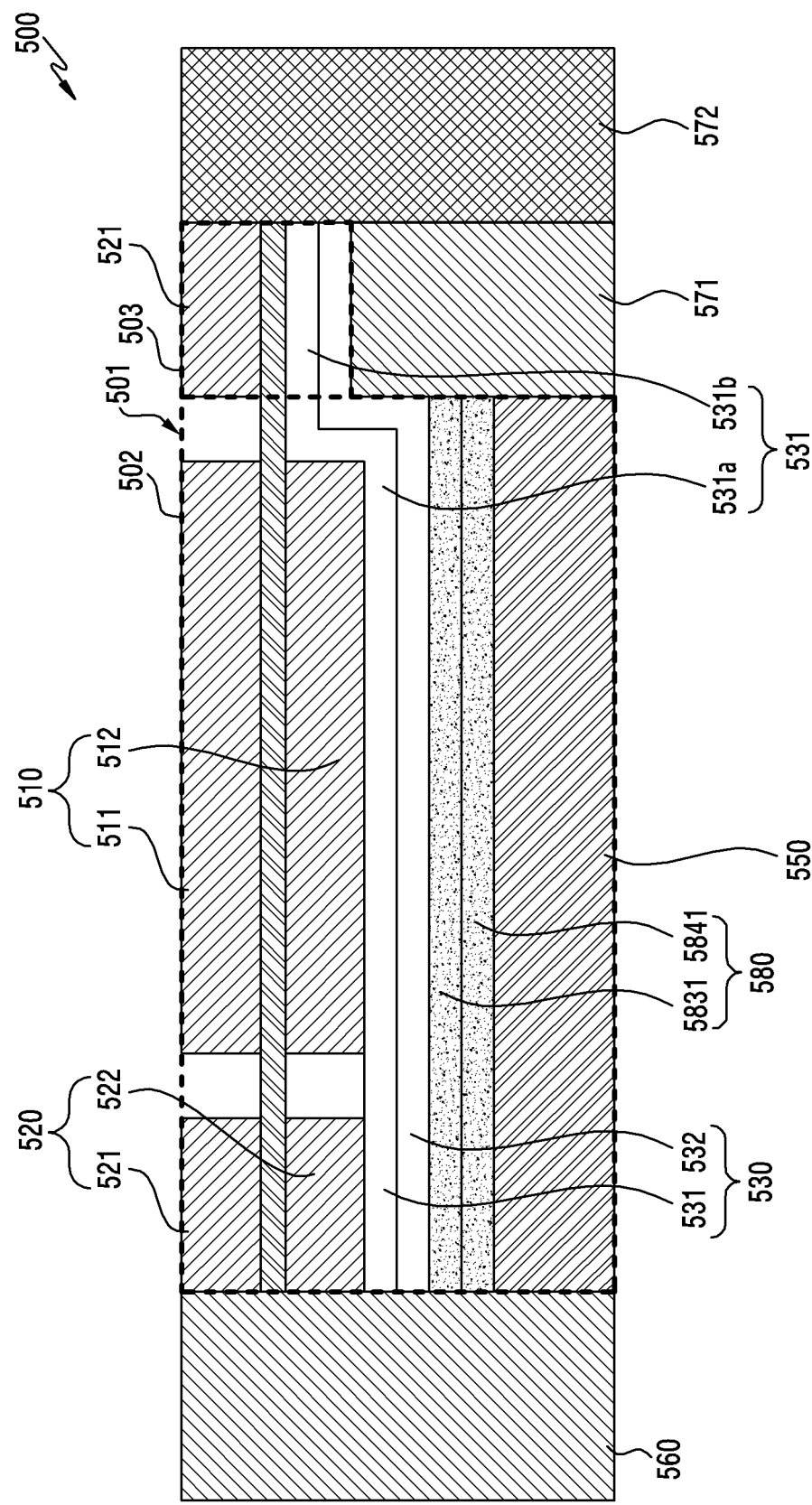
FIG. 7 is a cross-sectional view of an example NFC/wireless charging antenna including magnetic materials having different magnetic permeability according to various embodiments.

Referring to FIG. 7, it is an example in which the material of the third magnetic substance 533 and the fourth magnetic substance 534 is changed in the antenna module shown in FIG. 5. The electronic device 500 may include a first magnetic substance 531 of the antenna module 501, a second magnetic substance 532 having the same characteristic as the first magnetic substance, a third magnetic substance 5831 having a different characteristic from the first magnetic substance 531 and the second magnetic substance, and a fourth magnetic substance 5841 having the same characteristic as the third magnetic substance 5831. The electronic device 500 shown in FIG. 5 may be the same as or similar to the electronic device shown in FIG. 5 except for the third magnetic substance 5831 and the fourth magnetic substance 5841, so repeated description may not be provided.

According to an embodiment, a magnetic substance 530 may be disposed under the base 505. The magnetic substance 530 may be disposed under the wireless charging coil 510. The magnetic substance 530 can concentrate the traveling directions the magnetic field formed by the wireless charging coil 510 or the NFC coil 520. The magnetic substance 530 may be stacked in a plurality of layers. The magnetic substance 530 can prevent and/or reduce the magnetic fields formed by the wireless charging coil 510 or the NFC coil 520 from being offset by the electronic parts in the electronic device 500.

According to an embodiment, the magnetic substance 530 may include a first magnetic substance 531, a second magnetic substance 532 disposed under the first magnetic substance 531, a third magnetic substance 5831 disposed under the second magnetic substance 531, and a fourth magnetic substance 5842 disposed under the third magnetic substance 5831. The first magnetic substance 531 and the second magnetic substance 532 can concentrate the directions of the magnetic fields of the NFC coil 520 and the wireless charging coil 510 to the rear surface of the electronic device. The third magnetic substance 5831 and the fourth magnetic substance 5841 can concentrate the directions of some magnetic fields of the wireless charging coil 510 and the NFC coil 520 to the rear surface of the electronic device.

According to an embodiment, the first magnetic substance 531 and the second magnetic substance 532 may be made of a material having high magnetic permeability and a low loss tangent in a band of 100 Khz~15 Mhz including a wireless charging band and an NFC antenna band. The third magnetic substance 5831 and the fourth magnetic substance 5841 may be made of a material having high magnetic permeability and a low loss tangent in a band of 10 Khz~200 Khz. For example, the first magnetic substance 531 and the second magnetic substance 532 may include a magnetic substance 530 including fine crystals. The third magnetic substance 5831 and the fourth magnetic substance 5841 may include a magnetic substance 580 having amorphous crystals. The third magnetic substance 5831 and the fourth magnetic substance 5841 may be made of the same kind of material, and the first magnetic substance 531 and the second magnetic substance 532 may be made of the same kind of material. The material of the third magnetic substance 5831 and the fourth magnetic substance 5841 has magnetic permeability higher than that of the first magnetic substance 531 and the second magnetic substance 532.

Figure 8A:
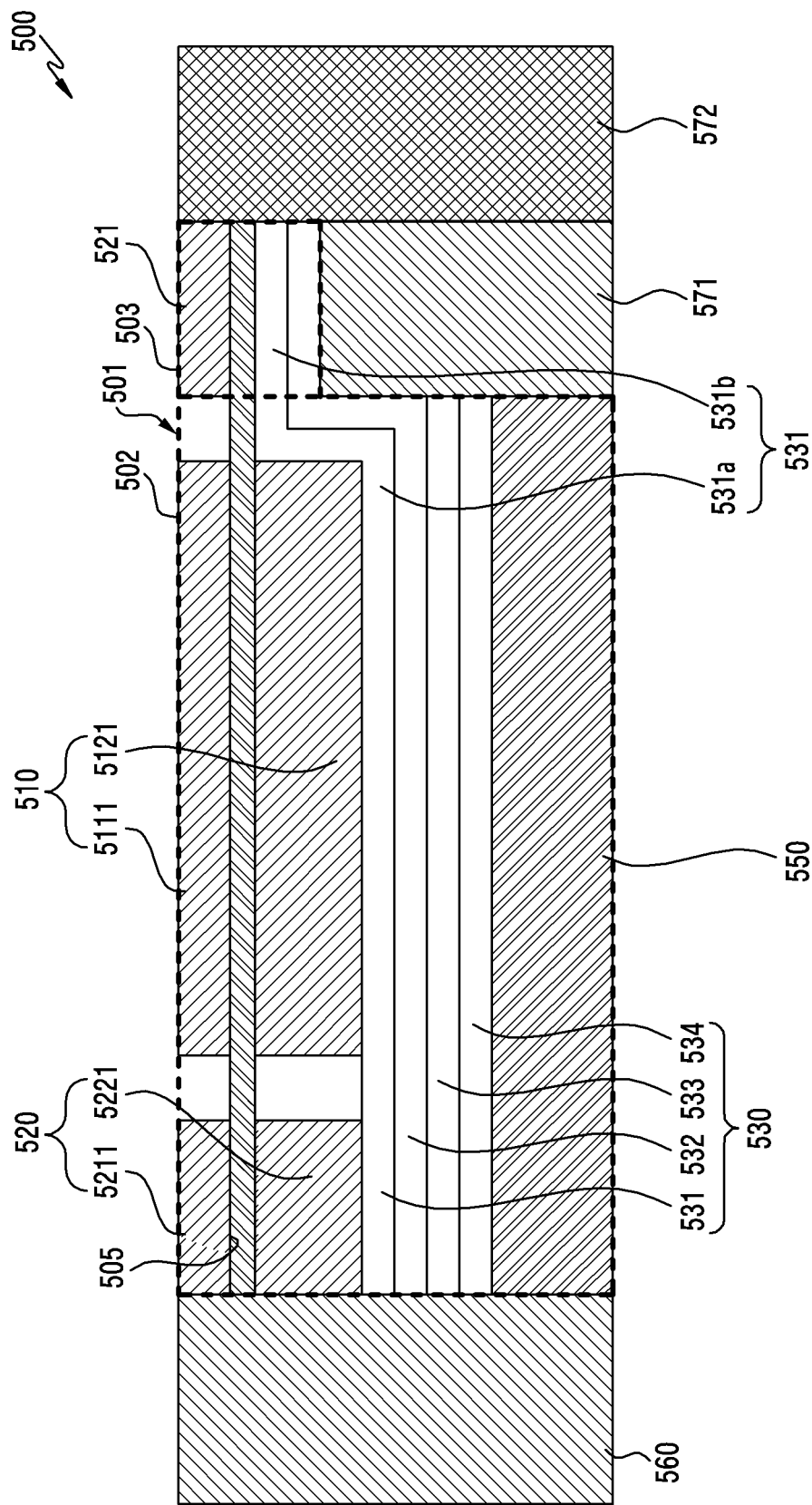
FIG. 8A is a cross-sectional view of an example NFC/wireless charging antenna including wireless charging coils having different thicknesses according to various embodiments.
Figure 8B:
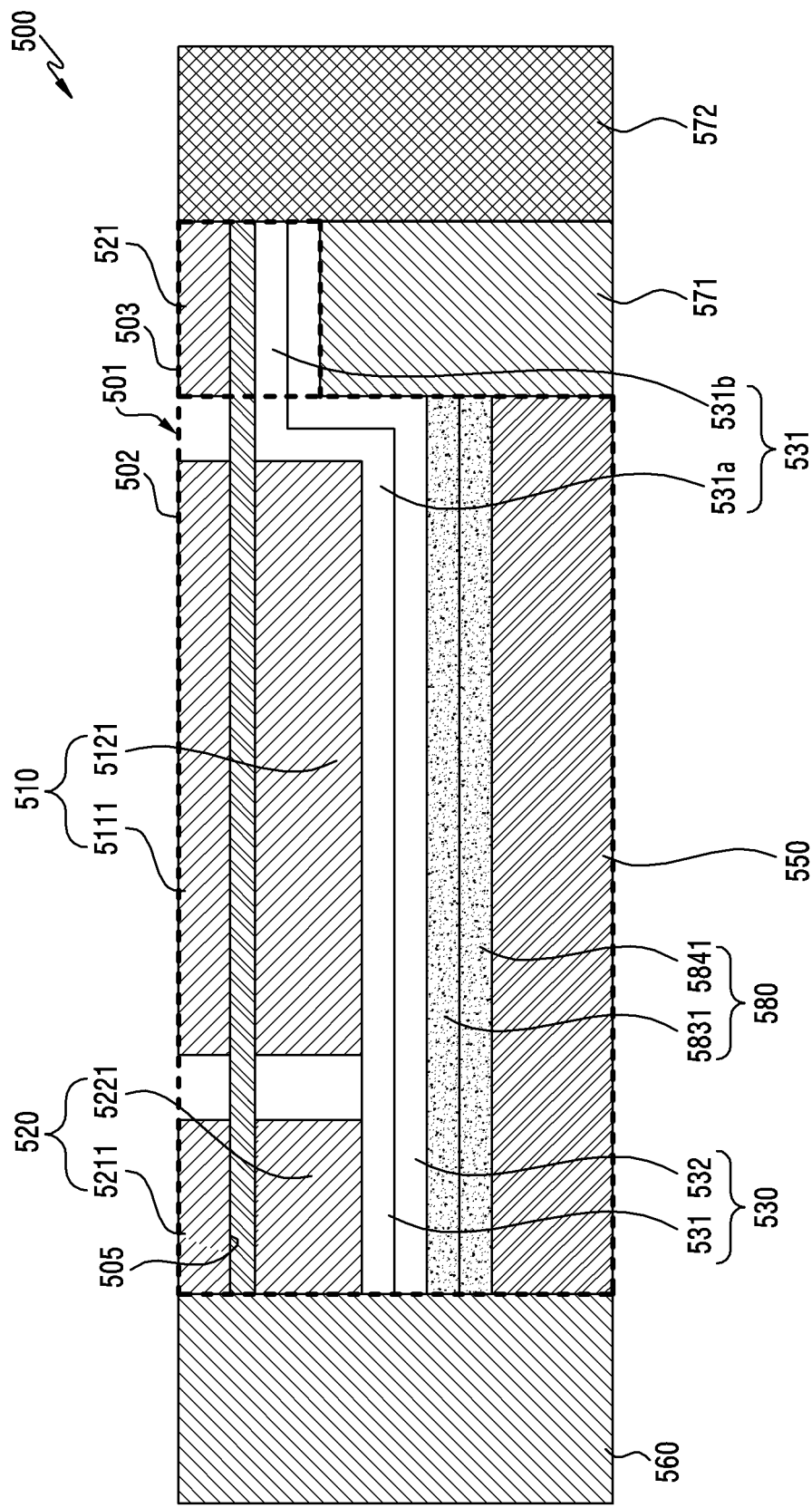
FIG. 8B is a cross-sectional view of the example NFC/wireless charging antenna including wireless charging coils having different thicknesses according to various embodiments.

FIG. 8A is a cross-sectional view illustrating an example NFC/wireless charging antenna including wireless charging coils having different thicknesses according to various embodiments and FIG. 8B is a cross-sectional view of the example NFC/wireless charging antenna including wireless charging coils having different thicknesses according to various embodiments.

FIG. 8A shows an example in which the thicknesses of the wireless charging coil 510 and the NFC coil 520 of the antenna module 501 shown in FIG. 5 are changed and FIG. 8B shows an example in which the thicknesses of the wireless charging coil 510 and the NFC coil 520 of the antenna module 501 shown in FIG. 7 are changed.

Referring to FIGS. 8A and 8B, a base 505 on which patterns of a wireless charging coil 510 and an NFC coil 520 are stacked, a magnetic substance disposed under the base 505 and preventing and/or reducing a magnetic field generated by a current flowing in the wireless charging coil 510 and the NFC coil 520 from being offset by electronic parts mounted in the electronic device, a heat dissipater 550 disposed under the magnetic substance 530 and dissipating heat, and a battery (e.g., the battery 350 in FIG. 3) disposed under the heat dissipater 550 may be disposed in the antenna module 501.

According to various embodiments, the wireless charging coil 510 may include a first wireless charging coil 5111 and/or a second wireless charging coil 5121 that are winding on the top and bottom surfaces of the base 505. The wireless charging coil 510 may include a material having conductivity. For example, the wireless charging coil 510 may include copper (Cu). The wireless charging coil 510 may be patterned on both surfaces of the base 505 to be wound in parallel around the top and bottom surface of the base 505. The wireless charging coil 510 may include the first wireless charging coil 5111 disposed over the base 505 and the second wireless charging coil 5121 disposed under the base 505. The thicknesses of the first wireless charging coil 5111 and the second wireless charging coil 5121 may be different.

According to an embodiment, the NFC coil 520 may include a first NFC coil 5211 patterned on the top surface of the base 505 or a second NFC coil 5221 patterned on the bottom surface of the base 505. The first NFC coil 5211 may be disposed outside the first wireless charging coil 5111 on the top surface of the base 505. The first wireless charging coil 5111 may be disposed inside the first NFC coil 5211 on the top surface of the base 505. The first NFC coil 5211 and the first wireless charging coil 5111 may be spaced apart from each other. For example, the first NFC coil 5211 may be disposed on the top surface of the base 505 to surround the first wireless charging coil 5111.

The second NFC coil 5221 may be disposed outside the second wireless charging coil 5121 on the bottom surface of the base 505. The second wireless charging coil 5121 may be disposed inside the second NFC coil 5221 on the bottom surface of the base 505. The second NFC coil 5221 and the second wireless charging coil 5121 may be spaced apart from each other. For example, the second NFC coil 5221 may be disposed on the bottom surface of the base 505 to surround the second wireless charging coil 5121.

The antenna module 501 may be divided into a first region 502 in which the wireless charging coil and the NFC coil 520 are disposed on both of the top and bottom surfaces and a second region 503 in which at least a portion of the second NFC coil 522 disposed on the bottom surface of the base is removed.

The thicknesses of the first wireless charging coil 5111 and the first NFC coil 5211 may be substantially the same. The thicknesses of the second wireless charging coil 5121 and the second NFC coil 5221 may be substantially the same. The thicknesses of the first wireless charging coil 5111 and the second wireless charging coil 5121 may be different from each other, and the first wireless charging coil 5111 may be formed thinner than the second wireless charging coil 5121. The thicknesses of the first NFC coil 5211 and the second NFC coil 5221 may be different from each other, and the first NFC coil 5211 may be formed thinner than the second NFC coil 5221.

The thickness of the wireless charging coil 520 shown in FIG. 7 may be the same as the thickness of the wireless charging coil 510 shown in FIG. 8A. The wireless charging coil 510, the first wireless charging coil 5111, and the second wireless charging coil 5121 shown in FIG. 8A may be different. The first wireless charging coil 5111 may be formed thinner than the second wireless charging coil 5121.

The thicknesses of the second wireless charging coil 5121 and the second NFC coil 522 may be the same, and the second NFC coil 522 may be removed with the same thickness. A space in which the second flexible printed circuit board 571 can be disposed can be secured by the region of the removed second NFC coil 522. For example, the thickness of the wireless charging coil 510 shown in FIG. 7 may be 110 um, and the thicknesses of the first wireless charging coil 511 and the second wireless charging coil 512 may be 55 um. In this case, the thickness that is additionally secured by removing the second NFC coil 522 may be 55 um. In FIG. 8A, the thickness of the wireless charging coil 510 is the same as 110 um, the thickness of the first wireless charging coil 5111 may be 30 um, and the thickness of the second wireless charging coil 5121 may be 80 um. The thickness that is additionally secured by removing the second NFC coil 522 may be 80 um.

Since the second NFC coil 5221 is removed in the second region 503, the mounting space at the lower portion of the second region 503 can be increased, so a larger space in which the second flexible printed circuit board 571 can be disposed can be secured.

The first magnetic substance 531, the second magnetic substance 532, the third magnetic substance 533, and the fourth magnetic substance 544 shown in FIG. 8A may have the same characteristics. The first magnetic substance 531, the second magnetic substance 532, the third magnetic substance 533, and the fourth magnetic substance 534 concentrate the directions of the magnetic fields generated by the NFC coil 520 and the wireless charging coil 510 to the rear surface of the electronic device. The first magnetic substance 531, the second magnetic substance 532, the third magnetic substance 533, and the fourth magnetic substance 534 may be made of a material having high magnetic permeability and a low loss tangent in the bands of the NFC coil 520 and the wireless charging coil 510. The first magnetic substance 531, the second magnetic substance 532, the third magnetic substance 533, and the fourth magnetic substance 534 may include a material having fine crystals and may have high magnetic permeability and a low loss tangent in the bands of about 10 Khz to 15 Mhz of the wireless charging coil 510 and the NFC coil 520. The magnetic substance 530 can be used as a strong magnetic substance in the band of about 10 Khz to 15 Mhz of the wireless charging coil 510 and the NFC coil 520, so it can minimize and/or reduce the influence by electronic parts disposed around the antenna module 501, whereby it is possible to improve the performance of the wireless charging coil 510 and the NFC coil 520.

The first magnetic substance 531 and the second magnetic substance 532 shown in FIG. 8B may be the same as the magnetic substance 530 shown in FIG. 8A. The third magnetic substance 5831 and the fourth magnetic substance 5841 may have characteristics different from those of the first magnetic substance 531 and the second magnetic substance 532.

The first magnetic substance 531 and the second magnetic substance 532 can concentrate the directions of the magnetic fields of the NFC coil 520 and the wireless charging coil 510 to the rear surface of the electronic device. The third magnetic substance 5831 and the fourth magnetic substance 5841 can concentrate the directions of some magnetic fields of the wireless charging coil 510 and the NFC coil 520 to the rear surface of the electronic device.

According to an embodiment, the first magnetic substance 531 and the second magnetic substance 532 may be made of a material having high magnetic permeability and a low loss tangent in a band of 100 Khz~15 Mhz including a wireless charging band and an NFC antenna band. The third magnetic substance 5831 and the fourth magnetic substance 5841 may be made of a material having high magnetic permeability and a low loss tangent in a band of 10 Khz~200 Khz. For example, the first magnetic substance 531 and the second magnetic substance 532 may include a magnetic substance 530 including fine crystals. The third magnetic substance 5831 and the fourth magnetic substance 5841 may include a magnetic substance 580 having amorphous crystals. The third magnetic substance 5831 and the fourth magnetic substance 5841 may be made of the same kind of material, and the first magnetic substance 531 and the second magnetic substance 532 may be made of the same kind of material. The material of the third magnetic substance 5831 and the fourth magnetic substance 5841 has magnetic permeability higher than that of the first magnetic substance 531 and the second magnetic substance 532.

According to various embodiments, in FIGS. 5, 7, 8A, and 8B, a portion of the antenna module 500 may be removed and the second flexible printed circuit board 571 may be disposed in the space obtained by removing a portion of the antenna module 500. In various embodiments to be described with reference to FIGS. 9 to 14, a portion of an antenna module may be removed, and a first flexible printed circuit board and a second flexible printed circuit board may be disposed in the space formed by removing a portion of the antenna module.

Figure 9:
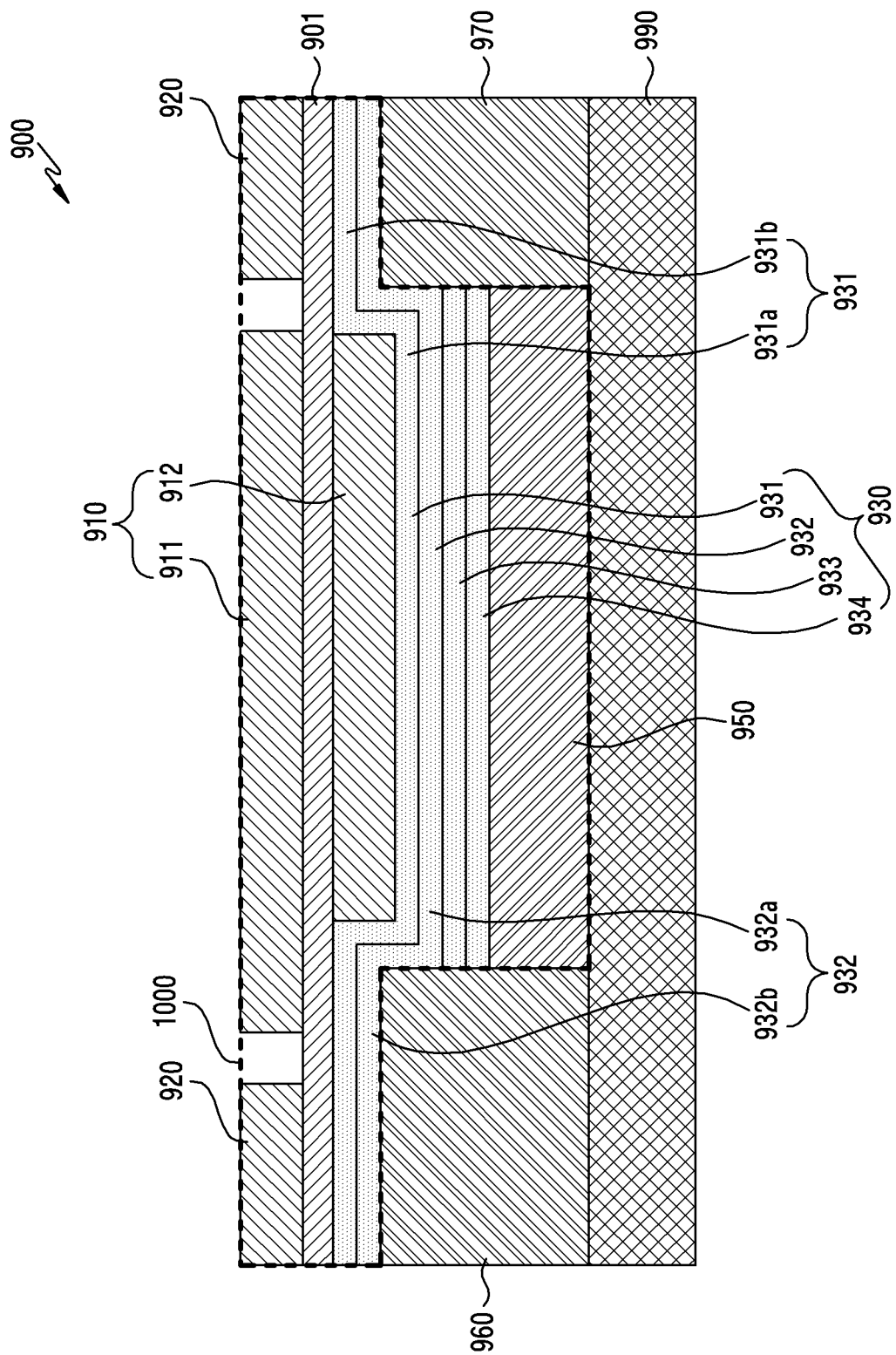
FIG. 9 is a cross-sectional view of an example NFC/wireless charging antenna in which an NFC coil is disposed on one surface and the widths of wireless charging coils are different in an antenna module according to various embodiments.
Figure 10A:
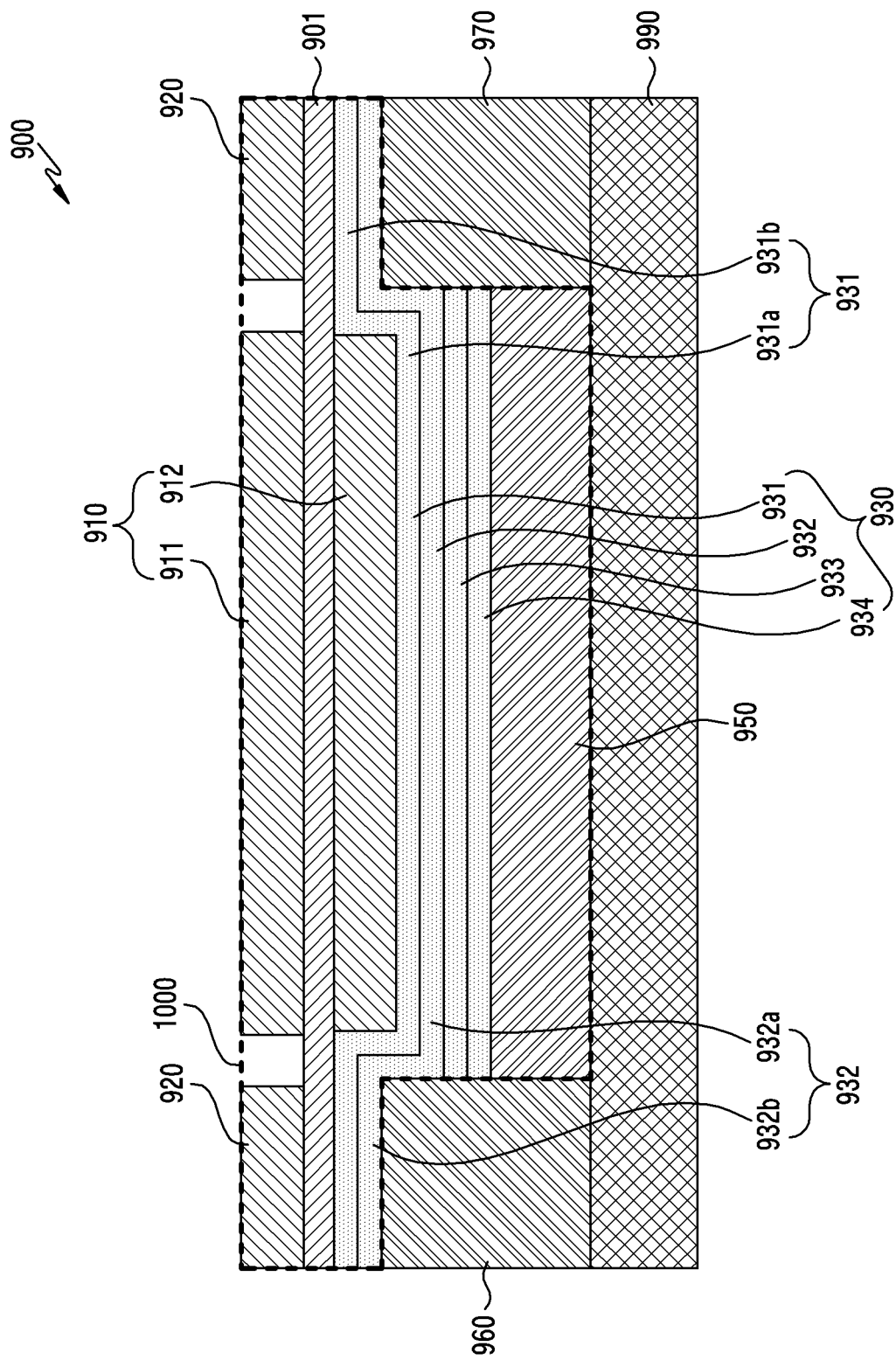
FIG. 10A is a cross-sectional view of an example NFC/wireless charging antenna having an NFC coil only on one surface in an antenna module according to various embodiments.
Figure 10B:
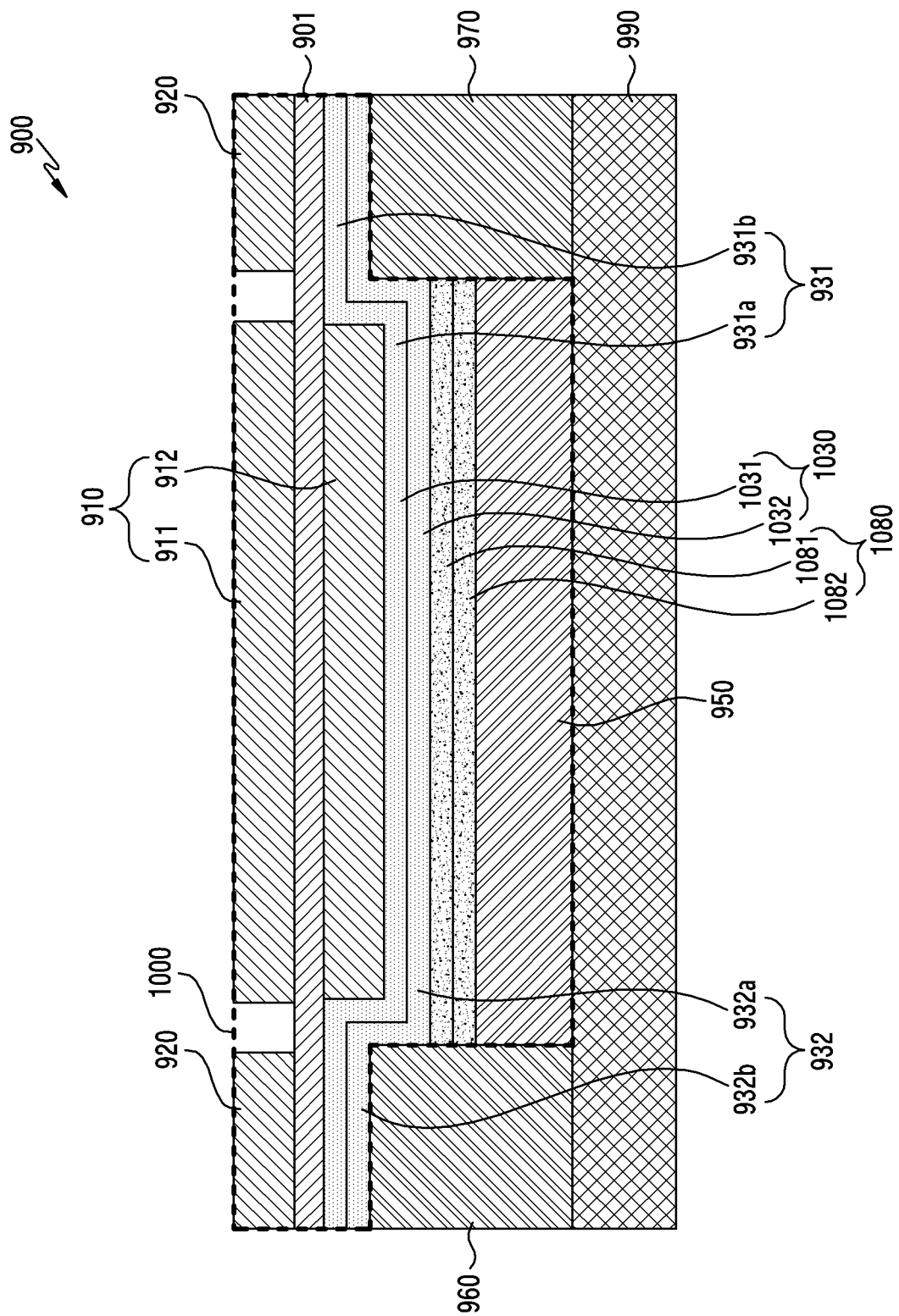
FIG. 10B is a cross-sectional view of the example NFC/wireless charging antenna having an NFC coil only on one surface in an antenna module according to various embodiments.

FIG. 9 is a cross-sectional view illustrating an example NFC/wireless charging antenna in which an NFC coil is disposed only on a surface and the widths of wireless charging coils are different in an antenna module according to various embodiments and FIGS. 10A and 10B are cross-sectional views in which an example NFC coil is disposed only one a surface in an antenna module according to various embodiments.

Referring to FIGS. 9 and 10A, an electronic device 900 may include an antenna module 1000, a plurality of first flexible printed circuit board 960 and second flexible printed circuit board 970 that is disposed adjacent to the antenna module 1000. A base 901 on which patterns of a wireless charging coil 910 and an NFC coil 920 are stacked, a magnetic substance 930 disposed under the base 901 and preventing and/or reducing a magnetic field generated by a current flowing in the wireless charging coil 901 and the NFC coil 920 from being offset by electronic parts mounted in the electronic device, a heat dissipater 950 disposed under the magnetic substance 930 and dissipating heat, and a battery 990 (e.g., the battery 350 in FIG. 4B) disposed under the heat dissipater 950 may be disposed in the antenna module 1000.

According to an embodiment, the base 901 is formed in a plate shape, and the wireless charging coil 910 and the NFC coil 920 may be patterned on the outer surface of the base 901. The base 901 may be a substrate made of a flexible material. For example, the base 901 may include polyimide (PI) that is used as a base material of a flexible printed circuit board. The magnetic substance 930 can minimize and/or reduce influence on the magnetic field, which is generated by a current flowing in the wireless charging coil 910 and the NFC coil 920, by various electronic parts disposed on a coil rear surface. For example, the magnetic substance 930 can prevent and/or reduce the battery, the printed circuit board, or the support member disposed on the surface on which the magnetic substance is positioned from offsetting the magnetic field generated by the wireless charging coil 910 or the NFC coil 920. The magnetic field generated by the wireless charging coil 910 and the NFC coil 920 may concentrate in the opposite direction to the magnetic substance 930. The magnetic substance 930 can concentrate the magnetic field generated by the wireless charging coil 910 to the surface on which the rear plate (e.g., the rear plate 380 in FIG. 3) of the housing is disposed, thereby being able to increase the charging efficiency of the battery by the wireless charging coil 910. Since a magnetic field from the NFC coil 920 can be concentrated to the rear plate by the magnetic substance 930, the NFC coil 920 can perform Near Field Communication (NFC) with an external electronic device (e.g., the electronic device 102 in FIG. 1). It is possible to communicate with an external device through the interaction between the NFC coil 920 and the magnetic substance and an electronic device can exchange data with the external device at a near field.

According to an embodiment, the wireless charging coil 910 may be patterned on the top and bottom surfaces of the base 901. The wireless charging coil 910 may include a material having conductivity. For example, the wireless charging coil 910 may be copper (Cu). The wireless charging coil 910 may be wound in parallel around the top and bottom surfaces of the base 901. For example, the wireless charging coil 910 may include a first wireless charging coil 911 patterned on the top surface of the base 901 and a second wireless charging coil 912 patterned on the bottom surface of the base. The winding region of the first wireless charging coil 911 disposed on the top surface of the base 901 may have a larger cross-sectional region than the winding region of the second wireless charging coil 912 disposed on the bottom surface of the base 901. For example, the region in which the first wireless charging coil 911 is disposed may be larger than the region in which the second wireless charging coil 912 is disposed. As another example, the area in which the first wireless charging coil 911 is in contact with the base 901 may be larger than the area in which the second wireless charging coil 912 is in contact with the base 901. The thicknesses of the first wireless charging coil 911 and the second wireless charging coil 912 may be substantially the same, but are not limited thereto. In the embodiments of FIGS. 8A, 8B, 11, 12, and 13 to be described below, the thicknesses of a top surface portion 911 and a bottom surface portion 912 may be different from each other.

According to an embodiment, the NFC coil 920 may be wound on the top surface of the base 901. The NFC coil 920 may be disposed outside the first wireless charging coil 911 on the top surface of the base 901. The first wireless charging coil 911 may be disposed inside the NFC coil 920 on the top surface of the base 901. The NFC coil 920 and the first wireless charging coil 911 may be spaced apart from each other.

The magnetic substance 930 may be disposed under the base 901. The magnetic substance 930 may be disposed under the wireless charging coil 910. The magnetic substance 930 can turn the magnetic field coming from the wireless charging coil 910 or the NFC coil 920 in the opposite direction to the magnetic substance. A plurality of magnetic substances 930 may be disposed in layers. The thickness of the magnetic substance 930 may be different, depending on their positions, and the disposed shape may also be different. The magnetic substance 930 may include only a first magnetic substance 931 and a second magnetic substance 932 in the region in which the second wireless charging coil 912 or the NFC coil 920 are removed, and may include a first magnetic substance 931, a second magnetic substance 932, a third magnetic substance 933, and a fourth magnetic substance 934 in a region corresponding to the second wireless charging coil 912. The thickness of the magnetic substance 930 in the region in which the second wireless charging coil 912 or the NFC coil 920 is removed may be smaller than the thickness of the magnetic substance 930 in the region corresponding to the second wireless charging coil 912.

According to an embodiment, the magnetic substance 930 may include a first magnetic substance 931, a second magnetic substance 931 disposed under the first magnetic substance 932, a third magnetic substance 933 disposed under the second magnetic substance 932, and a fourth magnetic substance 933 disposed under the third magnetic substance 934. The first magnetic substance 931 and the second magnetic substance 932 can electrically interact with the NFC coil 920 and the wireless charging coil 910. The third magnetic substance 933 and the fourth magnetic substance 934 can electrically interact with the wireless charging coil 910.

According to an embodiment, the first magnetic substance 931, the second magnetic substance 932, the third magnetic substance 933, and the fourth magnetic substance 934 may be made of the same material. The first magnetic substance 931, the second magnetic substance 932, the third magnetic substance 933, and the fourth magnetic substance 934 may be formed as layers having substantially the same thickness. The first magnetic substance 931, the second magnetic substance 932, the third magnetic substance 933, and the fourth magnetic substance 934 may be made of a material having high magnetic permeability and a low loss tangent in the bands of the NFC coil 920 and the wireless charging coil 910. The first magnetic substance 931, the second magnetic substance 932, the third magnetic substance 933, and the fourth magnetic substance 934 may include a material having fine crystals and may have high magnetic permeability and a low loss tangent in the bands of about 10 Khz to 15 Mhz of the wireless charging coil 910 and the NFC coil 920.

According to an embodiment, the first magnetic substance 931 may have a first portion 931a in which the wireless charging coil 910 is patterned on both surfaces of the base 901, and a second portion 931b that is disposed at a different height from the first portion 931a with respect to the battery and in which the wireless charging coil 910 or the NFC coil is patterned only one a surface of the base 901. The second portion 931b may be formed on at least one side of the first portion 931a. A surface of the first portion 931a and a surface of the second portion 531b may be disposed substantially in parallel. The second portion 931b may be disposed such that an inner end thereof is connected to an end of a bending portion bending from both ends of the first portion 931a. The second portion 931b may extend along a surface of the base 301 from an end of the bending portion.

According to various embodiments, the second wireless charging coil 912 may exist in the region in which the first portion 931a of the first magnetic substance 931 is disposed, but the second wireless charging coil 912 or the NFC coil 920 may be removed in the second region 931b of the first magnetic substance 931. The second portion 931b may be smoothly connected with the first portion 931b by the portions of the second wireless charging coil 912 or the NFC coil 920 removed from the base 901. The height difference between the first portion 931a and the second portion 931b may be determined in accordance with the thickness of the second wireless charging coil 912. The first magnetic substance 331 may bend at least twice or more. The second portion 921b may overlap at least a portion of the NFC coil 920 and the wireless charging coil 910. The first portion 931a may overlap at least a portion of the wireless charging coil 910.

According to an embodiment, the second magnetic substance 932 may have a center portion 932a and a second portion 932b being different in height from the first portion 932a. A surface of the first portion 932a and a surface of the second portion 932b may be disposed substantially in parallel. The second portion 931b may be disposed such that an inner end thereof is connected to an end of a bending portion bending from both ends of the first portion 932a. The second portion 932b may extend along a surface of the first portion 931b of the first magnetic substance 931 from an end of the bending portion. The second magnetic substance 932 may bend at least twice or more. The second portion 932b may overlap at least a portion of the NFC coil 920 and the wireless charging coil 910. The first portion 932a may overlap at least a portion of the wireless charging coil 910. The second magnetic substance 932 may be formed in a shape similar to that of the first magnetic substance 911 and may be disposed on a surface, which faces the battery 990, of the first magnetic substance 911.

According to an embodiment, the third magnetic substance 933 and the fourth magnetic substance 934 may be disposed under the second magnetic substance 932. The third magnetic substance 933 and the fourth magnetic substance 934 may be disposed at positions corresponding to the first portions 931a and 932a of the first magnetic substance 931 and the second magnetic substance 932. The third magnetic substance 933 and the fourth magnetic substance 934 may be disposed in a region in which a portion of the wireless charging coil 910 is positioned. For example, the third magnetic substance 933 and the fourth magnetic substance 934 may be disposed in a region corresponding to the second wireless charging coil 912 overlapping a portion of the first wireless charging coil 911. The area of the third magnetic substance 933 and the fourth magnetic substance 934 projected to a surface of the battery 990 may be smaller than that of the first and second magnetic substances 931 and 932. The third magnetic substance 933 and the fourth magnetic substance 934 may overlap at least a portion of the wireless charging coil 910.

According to an embodiment, the heat dissipater 950 may be disposed under the magnetic substance 930. The magnetic substance 950 may be disposed over the battery 990. The heat dissipater 950 may be made of a metal material. The heat dissipater 950 can discharge heat generated from the magnetic substance 930 or the base 901 to the outside. The heat dissipater 950 may be thick such that it can sufficiently dissipate heat generated by the wireless charging coil 910. The heat dissipater 950 may be disposed to overlap the third magnetic substance 933 and the fourth magnetic substance 934. The heat dissipater 950 may be disposed to overlap up and down at least a portion of the wireless charging coil 910. The heat dissipater 950 may include graphite having excellent heat dissipation ability to reduce heat generated by the wireless charging coil 910 or the battery 990, and may be a heat dissipation plate including a heat sink or a heat pipe.

The first flexible printed circuit board 960 shown in FIG. 9 may be disposed in a space formed by removing a portion of the NFC coil 920 and the second wireless charging coil 912 and the second flexible printed circuit board 970 may be disposed in the space formed by removing the NFC coil 920. The third flexible printed circuit board (not shown) may be disposed adjacent to the side, which is not in contact with the magnetic substances 1030 and 1080, of the sides of the second flexible printed circuit board 970. The first flexible printed circuit board 960 (e.g., the first flexible printed circuit board 460 in FIG. 4A) may be disposed at a side formed by the heat dissipater 350, the third magnetic substance 333, and the fourth magnetic substance 334. The first flexible printed circuit board 960 may be disposed in a space secured by removing at least a portion of the wireless charging coil 910 and the NFC coil 920. The first flexible printed circuit board 960 may be disposed on a surface of the second portion 932b of the second magnetic substance 932. The first flexible printed circuit board 960 may be disposed over the battery 990. For example, the space in which the first flexible printed circuit board 360 is disposed may be formed and surrounded by the second portion 932b of the second magnetic substance 932, a connecting portion connecting the first portion 932a and the second portion 932b of the second magnetic substance 932, sides of the third magnetic substance 933 and the fourth magnetic substance 934, a side of the heat dissipater 950, and at least a portion of the battery 990. The space in which the first flexible printed circuit board 960 is disposed may be a space formed by removing a portion of the second wireless charging coil 912 and a portion of the NFC coil, and the space may be a space in which the second wireless charging coil 912, the third magnetic substance 933, the fourth magnetic substance 934, and the heat dissipater 950 are removed. The first flexible printed circuit board 960 may overlap at least a portion of the NFC coil 320 and the wireless charging coil 910. The first flexible printed circuit board 960 may coincide with at least sides of the NFC coil 920 and the base 901, and may extend toward the center of the base 901 relatively to the NFC coil 920.

In FIGS. 10A and 10B, the first flexible printed circuit board 960 may be disposed in a space formed by removing a portion of the NFC coil 920, the second flexible printed circuit board 970 may be disposed in a space formed by removing a portion of the NFC coil 920, and the second flexible printed circuit board 970 may be disposed in a space formed by removing the NFC coil 920. The third flexible printed circuit board (not shown) may be disposed adjacent to the side, which is not in contact with the magnetic substances 1030 and 1080, of the sides of the second flexible printed circuit board 970. The first flexible printed circuit board 960 (e.g., the first flexible printed circuit board 460 in FIG. 4A) may be disposed at a side formed by the heat dissipater 950, the third magnetic substance 933, and the fourth magnetic substance 934. The first flexible printed circuit board 960 may be disposed in a space secured by removing the NFC coil 920 disposed on a surface of the base 901. The first flexible printed circuit board 960 may be disposed on a surface of the second portion 932b of the second magnetic substance 932. The first flexible printed circuit board 960 may be disposed over the battery 990. For example, the space in which the first flexible printed circuit board 360 is disposed may be formed and surrounded by the second portion 932b of the second magnetic substance 932, the connecting portion of the second magnetic substance 932, sides of the third magnetic substance 933 and the fourth magnetic substance 934, a side of the heat dissipater 950, and at least a portion of the battery 990. The space in which the first flexible printed circuit board 960 is disposed may be a space formed by removing a portion of the NFC coil and may be a space in which the second wireless charging coil 912, the third magnetic substance 933, the fourth magnetic substance 934, and the heat dissipater 950 are removed. The first flexible printed circuit board 960 may overlap the NFC coil 920. At least a side of the first flexible printed circuit board 960 may be the same as sides of the NFC coil 920 and the base 901.

According to an embodiment, the second flexible printed circuit board 970 (e.g., the second flexible printed circuit board 471 shown in FIG. 4A) may be disposed on the other surface of the heat dissipater 950 shown in FIGS. 9 and 10A.

The second flexible printed circuit board 970 may be disposed at a side opposite to a side at which the first flexible printed circuit board 960 is disposed from the third magnetic substance 933 or the fourth magnetic substance 934. The second flexible printed circuit board 970 may be disposed under the second portion 932b of the second magnetic substance 932. The second flexible printed circuit board 970 may be disposed over the battery 990. The second flexible printed circuit board 970 may overlap a portion of the NFC coil 920. The second flexible printed circuit board 970 may be disposed in a space secured by removing the NFC coil 920. The space in which the first flexible printed circuit board 970 is disposed may be a space formed by removing a portion of the NFC coil and may be a space in which the third magnetic substance 933, the fourth magnetic substance 934, and the heat dissipater 950 are removed.

Referring to FIG. 10B, the characteristics of the third magnetic substance 1082 and the fourth magnetic substance 1082 may be different in the NFC/wireless charging antenna shown in FIG. 10a. The first magnetic substance 1031 and the second magnetic substance 1032 shown in FIG. 10B may be the same as the magnetic substance 930 shown in FIG. 9. The third magnetic substance 1081 and the fourth magnetic substance 1082 may have characteristics different from those of the first magnetic substance 1031 and the second magnetic substance 1032.

The first magnetic substance 1031 and the second magnetic substance 1032 can concentrate the directions of the magnetic fields of the NFC coil 920 and the wireless charging coil 910 to the rear surface of the electronic device. The third magnetic substance 1081 and the fourth magnetic substance 1082 can concentrate the directions of some magnetic fields of the wireless charging coil 910 and the NFC coil 920 to the rear surface of the electronic device.

According to an embodiment, the first magnetic substance 1031 and the second magnetic substance 1032 may be made of a material having high magnetic permeability and a low loss tangent in a band of 100 Khz~15 Mhz including a wireless charging band and an NFC antenna band. The third magnetic substance 1081 and the fourth magnetic substance 1082 may be made of a material having high magnetic permeability and a low loss tangent in a band of 10 Khz~200 Khz. For example, the first magnetic substance 1031 and the second magnetic substance 1032 may include a magnetic substance 1030 including fine crystals. The third magnetic substance 1081 and the fourth magnetic substance 1082 may include a magnetic substance 1080 having amorphous crystals. The third magnetic substance 1081 and the fourth magnetic substance 1082 may be made of the same kind of material, and the first magnetic substance 1031 and the second magnetic substance 1032 may be made of the same kind of material. The material of the third magnetic substance 1081 and the fourth magnetic substance 1082 has magnetic permeability higher than that of the first magnetic substance 1031 and the second magnetic substance 1032.

According to another embodiment, the thicknesses of the first magnetic substance 1031 and the second magnetic substance 1032 may be larger than the thicknesses of the third magnetic substance 1081 and the fourth magnetic substance 1082.

Figure 11:
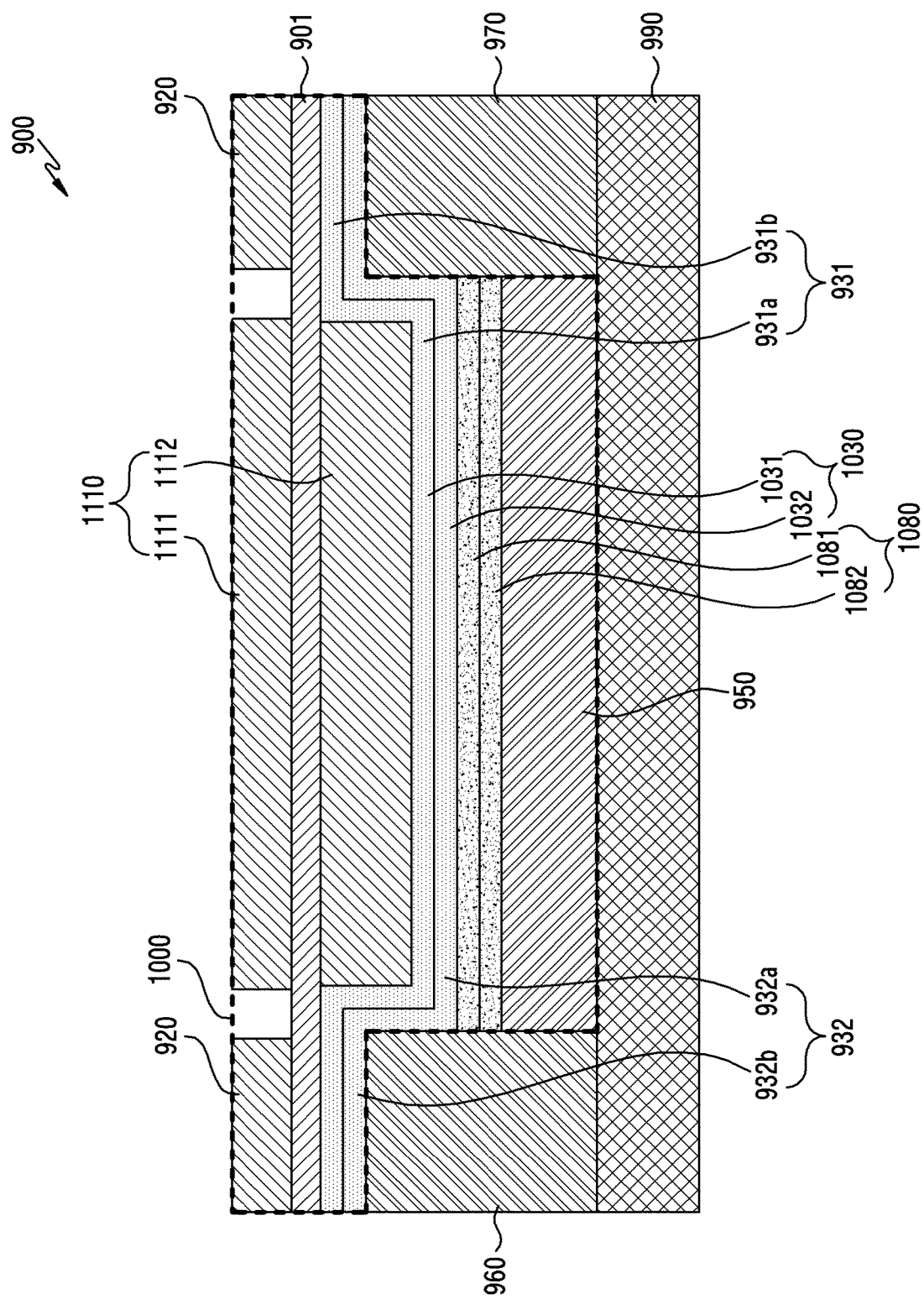
FIG. 11 is a cross-sectional view of an example NFC/wireless charging antenna in which the characteristics of magnetic materials of the NFC/wireless charging antenna shown in FIG. 10B are different according to various embodiments.

FIG. 11 is a cross-sectional view of an example NFC/wireless charging antenna in which the characteristics of magnetic substances of the NFC/wireless charging antenna shown in FIG. 10B are different.

Referring FIG. 11, an electronic device 900 may include an antenna module 1000, a plurality of first flexible printed circuit board 960 and second flexible printed circuit board 970 that is disposed adjacent to the antenna module 1000. The second flexible printed circuit board 970 may be disposed in a space formed by removing the NFC coil 920. The third flexible printed circuit board (not shown) may be disposed adjacent to the side, which is not in contact with the magnetic substances 1030 and 1080, of the sides of the second flexible printed circuit board 970. A base 901 on which a wireless charging coil 910 and an NFC coil 920 are wound, a magnetic substance 930 disposed under the base 901 and preventing and/or reducing a magnetic field generated by a current flowing in the wireless charging coil 901 and the NFC coil 920 from being offset by electronic parts mounted in the electronic device, a heat dissipater 950 disposed under the magnetic substance 930 and dissipating heat, and a battery 990 (e.g., the battery 350 in FIG. 4B) disposed under the heat dissipater 950 may be disposed in the antenna module 1000.

The base 901 is formed in a plate shape, and the wireless charging coil 910 and the NFC coil 920 may be patterned on the outer surface of the base 901. The base 901 may be a substrate made of a flexible material. For example, the base 901 may include polyimide (PI) that is used as a base material of a flexible printed circuit board. The magnetic substance 930 can minimize and/or reduce influence on the magnetic field, which is generated by a current flowing in the wireless charging coil 910 and the NFC coil 920, by various electronic parts disposed on a coil rear surface. For example, the magnetic substance 930 can prevent and/or reduce the battery, the printed circuit board, or the support member disposed on the surface on which the magnetic substance is positioned from offsetting the magnetic field generated by the wireless charging coil 910 or the NFC coil 920. The magnetic field generated by the wireless charging coil 910 and the NFC coil 920 may concentrate in the opposite direction to the magnetic substance 930. The magnetic substance 930 can concentrate the magnetic field generated by the wireless charging coil 910 to the surface on which the rear plate (e.g., the rear plate 380 in FIG. 3) of the housing is disposed, thereby being able to increase the charging efficiency of the battery by the wireless charging coil 910. Since a magnetic field from the NFC coil 920 can be concentrated to the rear plate by the magnetic substance 930, the NFC coil 920 can perform Near Field Communication (NFC) with an external electronic device (e.g., the electronic device 102 in FIG. 1). It is possible to communicate with an external device through the interaction between the NFC coil 920 and the magnetic substance and an electronic device can exchange data with the external device at a near field.

According to an embodiment, the wireless charging coil 1110 may be wound on the top and bottom surfaces of the base 901. The wireless charging coil 1110 may be made of a conductive material and, for example, the wireless charging coil 1110 may include copper (Cu). The wireless charging coil 1110 may be wound in parallel around the top and bottom surfaces of the base 1101. The wireless charging coil 1110 may include the first wireless charging coil 1111 disposed over the base 901 and the second wireless charging coil 1112 disposed under the base 901. The thicknesses of the first wireless charging coil 1111 and the second wireless charging coil 1112 may be different from each other.

According to an embodiment, the NFC coil 920 may be wound on the top surface of the base 901. The NFC coil 920 may be disposed outside the wireless charging coil 1110 on the top surface of the base 901. The wireless charging coil 1110 may be disposed inside the NFC coil 920 on the top surface of the base 901. The NFC coil 920 and the wireless charging coil 1110 may be spaced apart from each other. The NFC coil 920 and the wireless charging coil 1110 may have different bands of frequencies. The magnetic substance 930 can turn the magnetic field coming from the wireless charging coil 910 or the NFC coil 920 in the opposite direction to the magnetic substance.

According to an embodiment, the magnetic substance 430 may be disposed under the magnetic substance 401. The magnetic substance 400 may be disposed under the wireless charging coil 410. The magnetic substance 400 can electrically interact with the wireless charging coil 410 or the NFC coil 420. The magnetic substance 400 may be stacked in a plurality of layers. The magnetic substance 4300 may be thick such that it can prevent and/or reduce the magnetic field generated by the wireless charging coil 410 or the NFC coil 420 from being offset by electronic parts in the electronic device 900. The structures of the magnetic substances 1030 and 1080 may be the same as or similar to the structures of the magnetic substances shown in FIG. 10B, so the structures of the magnetic substances 1030 and 1080 are not described.

Figure 12:
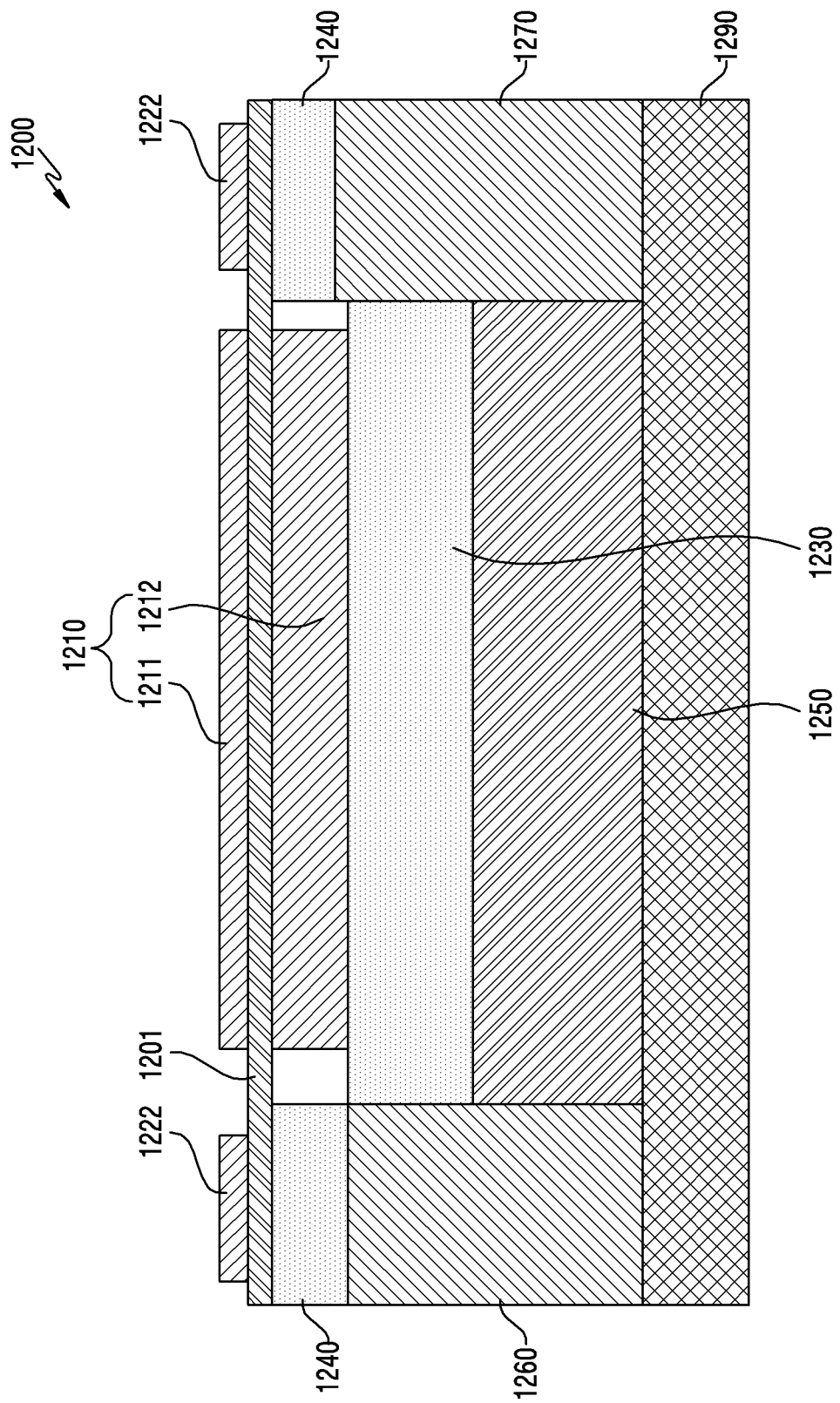
FIG. 12 is a cross-sectional view illustrating a modified example of the magnetic materials of the NFC/wireless charging antenna shown in FIG. 10A or FIG. 10B according to various embodiments.

FIG. 12 is diagram illustrating a modified example of the magnetic substances of the antenna module shown in FIG. 10A or FIG. 10B.

Referring to FIG. 12, a base 1201 on which a wireless charging coil 1210 and an NFC coil 1222 are patterned, a first magnetic substance 1230 disposed under the base 1201 and preventing and/or reducing a magnetic field formed by the wireless charging coil 1210 from being offset, a second magnetic substance 1240 preventing and/or reducing a magnetic field formed by the NFC coil 1222 from being offset, a heat dissipater 1250 disposed under the first magnetic substance 1230 and dissipating heat, and a battery 1290 (e.g., the battery 350 shown in FIG. 3B) disposed under the heat dissipater 1250 may be disposed in an electronic device.

According to an embodiment, the base 1201 is formed in a plate shape, and the wireless charging coil 1210 and the NFC coil 1222 may be wound on a surface of the base 1201. The magnetic substance 1230 can prevent and/or reduce a magnetic field generated by the wireless charging coil from being offset by electronic parts in the electronic device. The wireless charging coil 1210 can charge the battery 1290 by generating electromagnetic induction in cooperation with an external coil. The direction of the magnetic field generated by the NFC coil 1222 is concentrated in a direction, whereby the NFC coil 1222 can perform Near Field Communication. The NFC coil 1222 can communicate with an external device, so the electronic device can exchange data with the external device at a near field.

According to an embodiment, the wireless charging coil 1210 may be wound on the top and bottom surfaces of the base 1201. The wireless charging coil 1210 may be a conductor and, for example, copper (Cu). The wireless charging coil 1210 may be wound in parallel around the top and bottom surfaces of the base 1201. The winding region of the wireless charging coil 1210 disposed on the top surface of the base 1201 and the winding region of the second wireless charging coil 1210 disposed on the bottom surface of the base 1201 may overlap up and down each other. The wireless charging coil 1210 may include the first wireless charging coil 1211 disposed over the base 1201 and the second wireless charging coil 1212 disposed under the base 1201.

According to an embodiment, the first wireless charging coil 1211 may be formed thinner than the second wireless charging coil 1212. The second wireless charging coil 1212 may be thicker than the first wireless charging coil 1211. The first wireless charging coil 1211 may be thinner than the second wireless charging coil 1212.

According to an embodiment, the thicknesses of the first wireless charging coil 1211 and the second wireless charging coil 1212 may be different from each other. The thickness of the first wireless charging coil 1211 may be 30 μm and the thickness of the second wireless charging coil 1212 may be 80 μm. The thickness of the wireless charging coil 1210 may be the same as 110 μm, and the thickness of the second wireless charging coil 1212 may be increased by 25 μm, as compared with when the thicknesses of the first wireless charging coil 1211 and the second wireless charging coil 1212 are the same as 55 μm. Since a space in which the second NFC coil is not formed can be secured by the thickness of the second wireless charging coil, when the thickness of the second wireless charging coil is 80 μm, a mounting space for the first flexible printed circuit board 1260 or the second flexible printed circuit board 1270 can be secured. According to various embodiments, the thicknesses of the first wireless charging coil 1211 and the second wireless charging coil 1212 may be the same.

According to an embodiment, the NFC coil 1222 may be disposed along the edge of the first wireless charging coil 1211. The NFC coil 1222 may be spaced apart from the wireless charging coil 1210 and may be disposed outside the wireless charging coil 1210. The NFC coil 1222 may be formed in a ring shape outside the wireless charging coil 1210. The NFC coil 1222 may overlap a partial region of the second magnetic substance 1240. The NFC coil 1222 may be patterned only on the surface of the base 1201 on which the first wireless charging coil 1211 is disposed and may be removed or may not patterned on the surface of the base 1201 on which the second wireless charging oil 1212 is disposed.

According to an embodiment, the NFC coil 1222 and the wireless charging coil 1210 may have different bands of frequencies. The magnetic substances 1230 and 1240 may be disposed under the base 1201. The magnetic substances may include a first magnetic substance 1230 and a second magnetic substance 1240. The first magnetic substance 1230 may be disposed under the wireless charging coil 1210 and the second magnetic substance 1240 may be disposed under the NFC coil 1222. The first magnetic substance 1230 and the second magnetic substance 1240 can prevent and/or reduce a magnetic field generated by the wireless charging coil 1210 or the NFC coil 1222 from being offset and can determine the direction of the magnetic field.

According to an embodiment, the first magnetic substance 1230 may be disposed in contact with the second wireless charging coil 1212 and the second magnetic substance 1240 may be disposed in contact with the base 1201 in the region in which the NFC coil 1222 is disposed.

According to an embodiment, the first magnetic substance 1230 may be made of a material having high magnetic permeability and a low loss tangent in the frequency band of the wireless charging coil 1210. The second magnetic substance 1240 may be made of a material having high magnetic permeability and a low loss tangent in the frequency band of the NFC coil 1222. The first magnetic substance 1230 may be formed in plurality of layers. For example, the first magnetic substance 1230 may include four layers formed by stacking the same kind of substance up and down. The layers may be the same in thickness or may have different thicknesses.

According to an embodiment, the first magnetic substance 1230 may be made of a material having high magnetic permeability and a low loss tangent in a band of 100 Khz~15 Mhz including a wireless charging band. The second magnetic substance 640 may be made of a material having high magnetic permeability and a low loss tangent in a band of 10 Mhz-20 Mhz including an NFC band. For example, the first magnetic substance 1230 may be made of a material including a fine crystalline substance. The crystal of the second magnetic substance 620 may be a material including a ferrite or amorphous substance. The first flexible printed circuit board 1260 and the second flexible printed circuit board 1270 may be disposed under the second magnetic substance 1240. The second flexible printed circuit board 1270 may be disposed in a space formed by removing the NFC coil 1222. The third flexible printed circuit board (not shown) may be disposed adjacent to the side, which is not in contact with the magnetic substance 1230 or the heat dissipater 1250, of the sides of the second flexible printed circuit board 1270.

According to an embodiment, the heat dissipater 1250 may be disposed under the first magnetic substance 1230. For example, the heat dissipater 1250 may be disposed to overlap the wireless charging coil 1210 and the first magnetic substance 1230. The magnetic substance 1250 may be disposed over the battery 1290. The heat dissipater 1250 may have a metal material having high thermal conductivity and may include graphite. The heat dissipater 1250 may include a heat pipe or a heat sink. The heat dissipater 1250 can discharge heat generated from the wireless charging coil 1210 or heat generated from the battery 1290 to the outside. The heat dissipater 1250 can discharge heat generated from the first magnetic substance 130 or the base 1201 to the outside. The heat dissipater 1250 may be thick such that it can effectively discharge heat generated in the electronic device 1200 to the outside. The heat dissipater 1250 may overlap the first magnetic substance 1230. The heat dissipater 1250 may overlap the wireless charging coil 1210.

According to an embodiment, the first flexible printed circuit board 1260 (e.g., the first flexible printed circuit board 460 shown in FIG. 4A) and the second flexible printed circuit board 1270 (e.g., the second flexible printed circuit board 471 shown in FIG. 4A) may be disposed on the sides of the heat dissipater 1250.

According to various embodiments, the first flexible printed circuit board 1260 and the second flexible printed circuit board 1270 may be disposed to overlap the NFC coil 1222 and the second magnetic substance 1240. The NFC coil 622 does not have the second wireless charging coil 1212, unlike the wireless charging coil 610, so it is possible to secure a space in which the first and second flexible printed circuit boards 1260 and 1270 can be disposed by the thickness of the second wireless charging coil 1212. Further, since the heat dissipater 1250 is disposed in the region overlapping the wireless charging coil 1210, it is possible to secure a mounting space by the thickness of the heat dissipater 1250 in the region overlapping the NFC coil 1222. For example, the first flexible printed circuit board 1260 and the second flexible printed circuit board 1270 may be disposed in the region surrounded by the second magnetic substance 1240, the first magnetic substance 1230, the heat dissipater 1250, and the battery 1290. According to various embodiments, the thickness of the second wireless charging coil 1212 may be determined in accordance with the thickness of the flexible printed circuit board disposed under the NFC coil 1222.

According to various embodiments, when the battery 1290 is disposed to face the base 1201 and is disposed under the heat dissipater 1250, the sides thereof may be disposed to coincide with the sides of the first flexible printed circuit board 1260 and the second flexible printed circuit board 1270.

Figure 13:
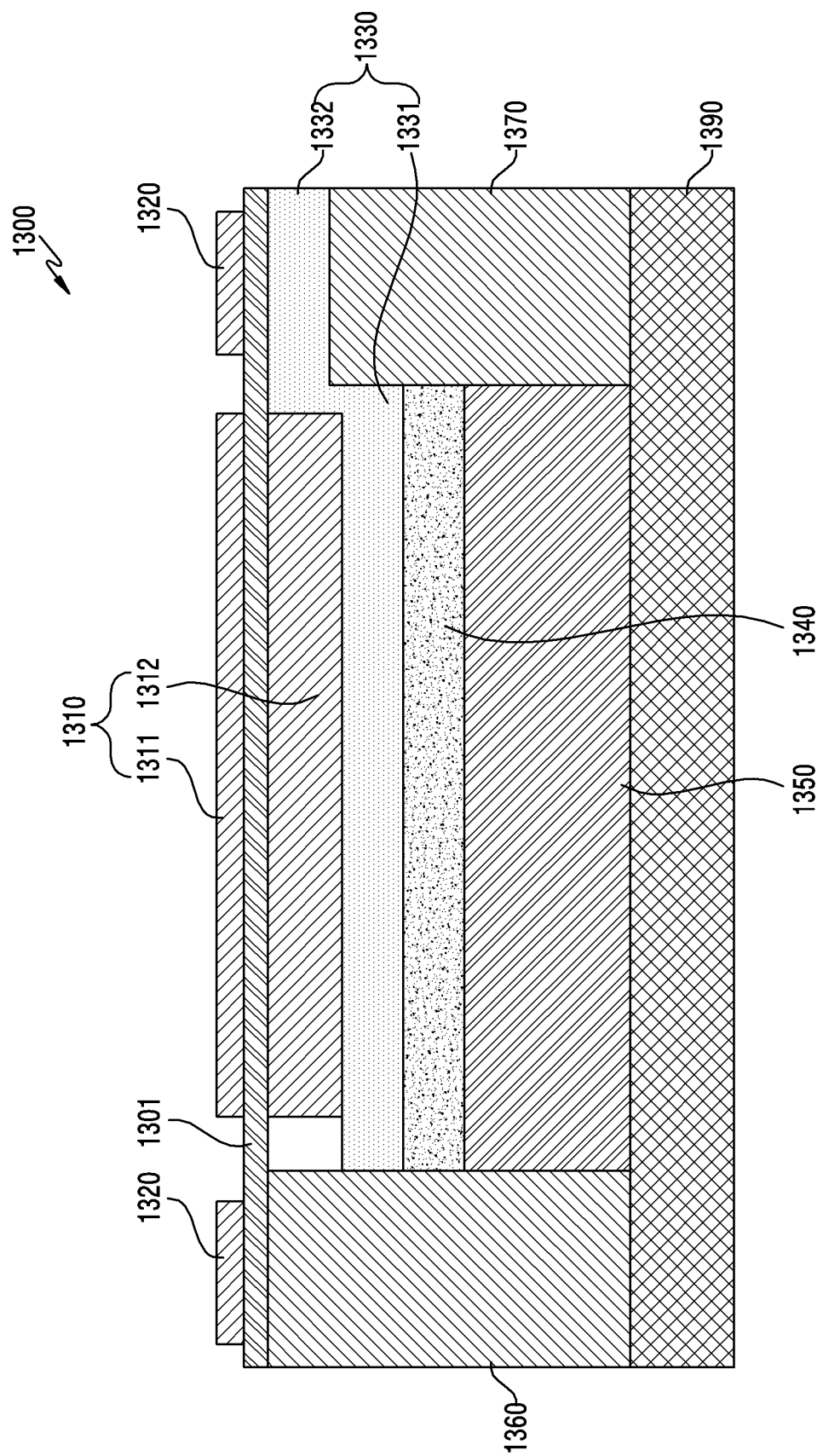
FIG. 13 is a cross-sectional view of an example NFC/wireless charging antenna with magnetic materials and a heat dissipater, which were disposed under NFC coils, removed according to various embodiments.

FIG. 13 is a cross-sectional view illustrating an example NFC/wireless charging antenna with magnetic substances and a heat dissipater, which were disposed under NFC coils, removed according to various embodiments.

Referring to FIG. 13, a base 1301 on which patterns of a wireless charging coil 1310 and an NFC coil 1320 are stacked, an upper magnetic substance 1330 and a lower magnetic substrate disposed under the base 1301 and preventing and/or reducing a magnetic field formed by the wireless charging coil 1301 and the NFC coil 1320 from being offset, a heat dissipater 1350 disposed under the lower magnetic substance 1330 and dissipating heat, and a battery 1390 (e.g., the battery 350 in FIG. 3) disposed under the heat dissipater 1350 may be disposed in an electronic device 1300.

According to an embodiment, the base 1301 is formed in a plate shape, and the wireless charging coil 1310 and the NFC coil 1320 may be wound on the outer surface of the base 1301. The wireless charging coil 1310 electrically interacts with the magnetic substance 1330, and the upper magnetic substance 1330 and the lower magnetic substance 1340 can prevent and/or reduce a magnetic field formed by the wireless charging coil 1310 from being offset by electronic parts in the electronic device. The wireless charging coil 1310 can charge the battery 1390 by generating electromagnetic induction in cooperation with an external coil and charging efficiency can be increased by the upper magnetic substance 1330 and the lower magnetic substance 1340. Since the direction of a magnetic field from the NFC coil 1320 can be concentrated in a direction, the NFC coil 920 can perform Near Field Communication (NFC) with an external electronic device (e.g., the electronic device 102 in FIG. 1). The NFC coil 1320 can exchange data with an external device at a near field. The magnetic substance 1330 can reduce influence on the magnetic field due to the electronic parts in the electronic device 1300.

According to an embodiment, the wireless charging coil 1310 may be patterned on the top and bottom surfaces of the base 1301. The wireless charging coil 1310 may be a conductor and, for example, copper (Cu) having high conductivity. The wireless charging coil 1310 may be wound in parallel around the top and bottom surfaces of the base 1301. The winding region of the first wireless charging coil 1311 disposed on the top surface of the base 1301 may have a larger cross-sectional area than the winding region of the second wireless charging coil 1312 disposed on the bottom surface of the base 1301. The wireless charging coil 1310 may include a first wireless charging coil 1311 disposed over the base 1301 and a second wireless charging coil 1312 disposed under the base 1301. The first wireless charging coil 1311 and the second wireless charging coil 1312 may be different in thickness. The first wireless charging coil 1311 may be thinner than the second wireless charging coil 1312, and it is possible to secure a mounting space for the first flexible printed circuit board 1360 and the second flexible printed circuit board 1370 by the thickness of the second wireless charging coil 1312. The second flexible printed circuit board 1370 may be disposed in a space formed by removing the NFC coil 1320. The third flexible printed circuit board (not shown) may be disposed adjacent to the side, which is not in contact with the magnetic substance 1330 or the heat dissipater 1350, of the sides of the second flexible printed circuit board 1370.

According to an embodiment, the NFC coil 1320 may be wound on the top surface of the base 1301. The NFC coil 1320 may be disposed outside the first wireless charging coil 1311 on the top surface of the base 1301. The first wireless charging coil 1311 may be disposed inside the NFC coil 1320 on the top surface of the base 1301. The NFC coil 1320 and the first wireless charging coil 1311 may be spaced apart from each other. The NFC coil 1320 may be disposed only on the top surface of the base 1301 and may be removed from or may not be patterned on the bottom surface of the base 1301. On the base 1301, the upper magnetic substance 1330 may be disposed in a partial region in which the NFC coil 1320 is not disposed and the first flexible printed circuit board 1360 may be disposed in the other region. The second flexible printed circuit board may be disposed at a position where the NFC coil 1320 and the upper magnetic substance 1330 overlap each other, in the region in which the supper magnetic substance 1330 is disposed.

According to an embodiment, the upper magnetic substance 1330 and the lower magnetic substance 1340 may be disposed under the base 1310. The upper magnetic substance 1330 may be disposed under the second wireless charging coil 1312. A portion of the upper magnetic substance 1330 may be disposed in a portion of the region in which the NFC coil has been removed. The magnetic substance 1330 can electrically interact with the wireless charging coil 1310 or the NFC coil 1320. The upper and lower magnetic substances 1330 and 1340 may be stacked in a plurality of layers. The thicknesses of the upper and lower magnetic substances 1330 and 1340 may be different, depending on their positions, and the disposed shape may also be different.

According to an embodiment, the upper magnetic substance 1330 may include a first upper magnetic substance 1331 and a second upper magnetic substance 1332. The first upper magnetic substance 1331 and the lower magnetic substance 1340 can prevent and/or reduce the magnetic field formed by the wireless charging coil 1310 from being offset, and the second upper magnetic substance 1332 can prevent and/or reduce the magnetic field formed by the NFC coil 1320 from being offset.

According to an embodiment, the first upper magnetic substance 1331 and the second upper magnetic substance 1332 may be made of the same material, and the lower magnetic substance 1340 may be made of a material different from that of the upper magnetic substance 1330.

For example, the upper magnetic substance 1330 may include a material having fine crystals and may have excellent magnetic permeability and a low loss tangent in the bands of the wireless charging coil 1310 and the NFC coil 1320 of about 100 Khz to 15 Mhz. The lower magnetic substance 1340 may include a material having amorphous crystals and may have excellent magnetic permeability and a low loss tangent in the band of the wireless charging coil 1310 of 10 Khz to 200 Khz.

According to an embodiment, the upper magnetic substance 1330 may include a first upper magnetic substance 1331 and a second upper magnetic substance 1332 disposed at a different height from the first upper magnetic substance 1331. The first upper magnetic substance 1331 may smoothly extend from the second upper magnetic substance 1332. The first upper magnetic substance 1331 may be disposed in a region, in which the wireless charging coil 1310 is not disposed, in contact with the second wireless charging coil 1312. The second upper magnetic substance 1332 may be disposed in a portion of the region in which the NFC coil 1320 has been removed on the surface of the base 1301 on which the second wireless charging coil 1310 is disposed. The first upper magnetic substance 1331 may be spaced apart from the base surface by the thickness of the second wireless charging coil 1312 and the second upper magnetic substance 1332 is disposed on the base 1301, so it may have an extension due to a height difference. A surface of the first upper magnetic substance 1331 and a surface of the second upper magnetic substance 1332 may be disposed substantially in parallel. The second upper magnetic substance 1332 may be disposed such that an inner end thereof is connected to an end of a bending portion bending from both ends of the first upper magnetic substance 1331. The second upper magnetic substance 1332 may extend along a surface of the base 1301 from an end of the bending portion. The first upper magnetic substance 1331 may bend at least twice or more. The second upper magnetic substance 732 may overlap a portion of the NFC coil 1320. The first upper magnetic substance 1331 may overlap at least a portion of the wireless charging coil 1310.

Only the first magnetic substance 1330 may be disposed in a partial region of the NFC coil 1320, and the first magnetic substance 1330 and the second magnetic substance may be disposed in a region corresponding to the wireless charging coil. The magnetic substance disposed in a partial region of the NFC coil 1320 may be thinner than the magnetic substances disposed in the region corresponding to the wireless charging coil.

According to an embodiment, the lower magnetic substance 1340 and may be disposed under the first upper magnetic substance 1331. The lower magnetic substance 1340 may be disposed to overlap up and down at least a portion of the wireless charging coil 1310.

According to an embodiment, the heat dissipater 1350 may be disposed under the lower magnetic substance 1340. The magnetic substance 1350 may be disposed over the battery 1390. The heat dissipater 1350 may be made of a metal material. The heat dissipater 1350 can discharge heat generated from the upper and lower magnetic substances 1330 and 1340 or the base 1301 to the outside. The heat dissipater 1350 may be thick such that it can sufficiently dissipate heat generated by the wireless charging coil 1310. The heat dissipater 1350 may be disposed to overlap the lower magnetic substance 1340 and the wireless charging coil 1310. The heat dissipater 1350 may include graphite having excellent heat dissipation ability to reduce heat generated by the wireless charging coil 1310 or the battery 1390, and may be a heat dissipation plate including a heat sink or a heat pipe.

According to an embodiment, the first flexible printed circuit board 1360 is disposed on sides of the upper magnetic substance 1330 and the lower magnetic substance 1340, and the upper portion thereof may be in direct contact with the base 1301. For example, the first flexible printed circuit board may be disposed in a space formed by the bottom surface of the base 1301, sides of the upper magnetic substance 1330 and the lower magnetic substance 1340, a side of the heat dissipater 1350, and the top surface of the battery 1390. A portion of the NFC antenna 1320 may not overlap the magnetic substances 1330 and 1340. The thickness of the first flexible printed circuit board 1360 may be increased by the magnetic substances 1330 and 1340, the heat dissipater 1350, and the space formed by removing the NFC coil 1320.

According to an embodiment, the first flexible printed circuit board 1370 is disposed on the bottom surface of the upper magnetic substance 1330 and a side of the lower magnetic substance 1340, and the upper portion thereof may be in direct contact with the upper magnetic substance 1330. For example, the first flexible printed circuit board 1320 may be disposed in a space formed by the bottom surface of the upper magnetic substance 1330, a side of the lower magnetic substance 1340, a side of the heat dissipater 1350, and the top surface of the battery 1390. The lower portion of the NFC coil 1320 does not overlap the lower magnetic substance 1340 and the thickness of the second flexible printed circuit board 1360 may be increased by the lower magnetic substance 1340 and the space formed by removing the NFC coil 1320.

Figure 14:
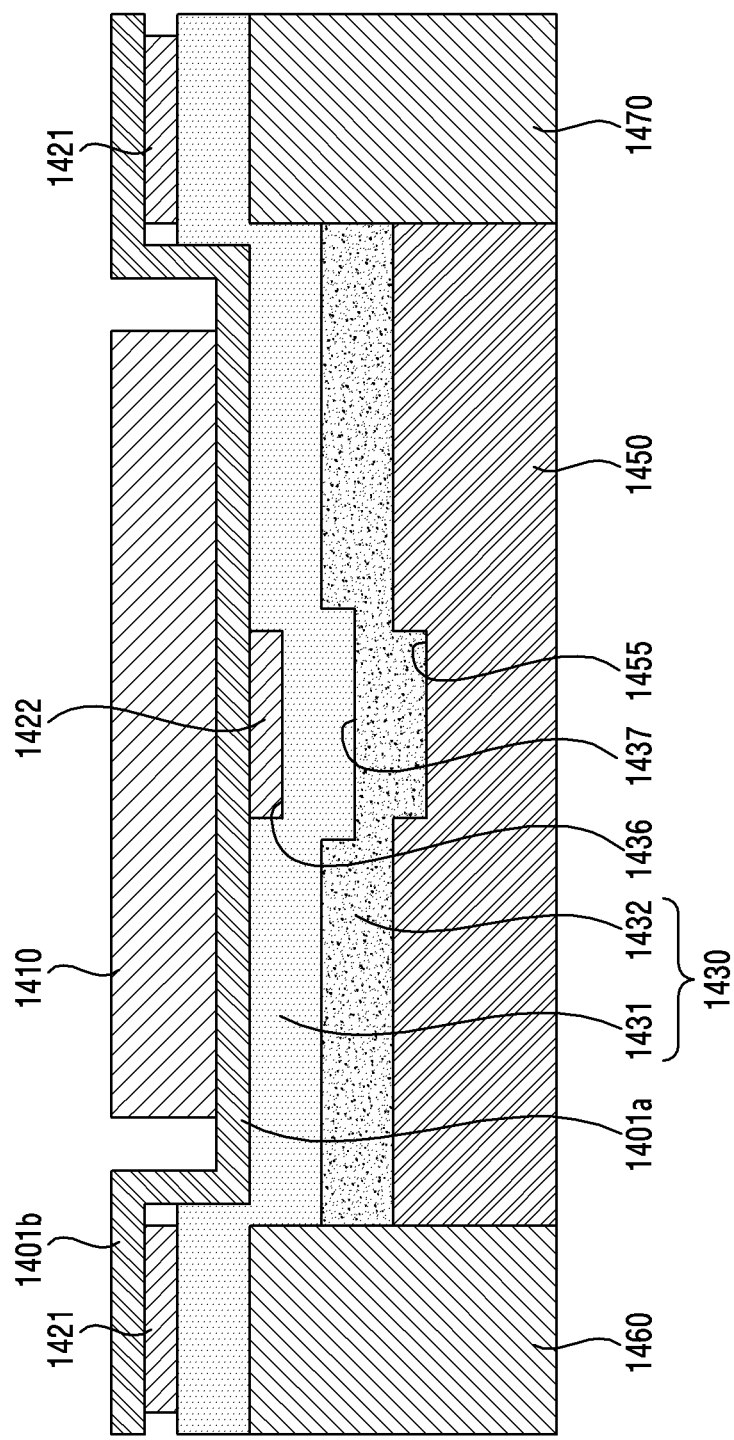
FIG. 14 is a cross-sectional view of an example NFC/wireless charging antenna having wireless charging coils or NFC coils disposed only on one surface according to various embodiments.

FIG. 14 is a cross-sectional view illustrating an example NFC/wireless charging antenna having wireless charging coils or NFC coils disposed only on one surface.

Referring to FIG. 14, an electronic device may include an NFC/wireless antenna that includes a base having a groove region 1401*a* and an edge region 1401*b*, a wireless charging coil 1410 disposed on the groove region 1401*a*, an NFC coil 1421 being in contact with the edge region 1401*b*, a magnetic substance 1430 disposed under the base 1401*a*, 1401*b*, and a heat dissipater 1450 disposed under the magnetic substance 1430.

The base 1401*a*, 1401*b* may include the groove region 1401*a* in which a first wireless charging coil 1410 can be disposed and the edge region 1401*b* in which the NFC coil 1421 can be disposed. The first wireless charging coil 1410 may be disposed in a portion that is recessed due to the groove region 1401*a* on a surface of the base. The NFC coil 1421 is disposed on the other surface of the edge region 1401*b* and can see the first wireless charging coil 1410 from the boundary of the edge region 1401*b* and the groove region 1401*a*. The NFC coil 1421 may be disposed along the edge region 1401*b* to surround the wireless charging coil 1410.

A second wireless charging coil 1422 may be disposed on a surface opposite to the surface on which the first wireless charging coil 1410 is disposed in the groove region 1401*a*. The second wireless charging coil 1422 may be disposed at a position corresponding to the center of the first wireless charging coil 1410 and may be electrically connected with the second wireless charging coil 1422 through a conductive via formed through the base 1401*a* by extending from the first wireless charging coil 1422 positioned at the center of the groove region 1401*a*. The shape of the second wireless charging coil 1422 may be a reduced shape, as compared with FIG. 12. For example, the second wireless charging coil 1422 may be smaller than the first wireless charging coil 1410. According to an embodiment, the edge region 1401*b* in which the NFC coil 1421 is positioned can secure a space corresponding to the thickness of the coil disposed over the base 1401*b* that should exist. According to an embodiment, the first flexible printed circuit board 1460 and the second flexible printed circuit board 1470 may be disposed in the lower region in which the NFC coil 1421 is positioned. The second flexible printed circuit board 1470 may be disposed in a space formed by removing the NFC coil 1421. The third flexible printed circuit board (not shown) may be disposed adjacent to the side, which is not in contact with the magnetic substance 1430 or the heat dissipater 1450, of the sides of the second flexible printed circuit board 1470.

According to various embodiments, a groove may be formed at the first magnetic substance 1431 as much as the region in which the second wireless charging coil 1422 is disposed. The thickness of the first magnetic substance 1431 can be uniformly maintained. The first magnetic substance 1431 may have a groove region 1401*a* in which the first wireless charging coil 1410 is disposed and an extension extending from the boundary of the edge region 1401*b* in which the first NFC coil is disposed. The first magnetic substance 1431 may have a first groove 1436 formed in a region corresponding to the second wireless charging coil 1422, and the second wireless charging coil 1422 may be disposed in the first groove 1436 and may have protrusion corresponding to the first groove 1436 on the other surface of the region in which the first groove 1436 is formed. The second magnetic substance 1432 may be disposed in a region corresponding to the groove region 1401*a* in which the first wireless charging coil 1411 is disposed. The second magnetic substance 1432 may have a second groove 1436 corresponding to the protrusion of the first magnetic substance 1431 and the protrusion of the first magnetic substance 1431 may be disposed in the second groove 1436. The second magnetic substance 1432 may have a protrusion corresponding to the second groove 1436 on the other surface of the region in which the second groove 1437 is formed.

According to various embodiments, the heat dissipater 1450 may be disposed under the second magnetic substance 1432. The heat dissipater 1450 may have a third groove 1455 corresponding to the protrusion of the second magnetic substance 1432 and may be disposed at a position corresponding to the groove region 1401*a*.

The first magnetic substance 1431 may have a characteristic different from that of the second magnetic substance 1432. The first magnetic substance 1431 can concentrate the directions of the magnetic fields of the first NFC coil 1421, the first wireless charging coil 1410, and the second wireless charging coil 1422 to the rear surface of the electronic device. The second magnetic substance 1432 can concentrate the directions of the magnetic fields generated from portions of the first wireless charging coil 1410 and the second wireless charging coil 1422 to the rear surface of the electronic device.

According to an embodiment, the first magnetic substance may be made of a material having high magnetic permeability and a low loss tangent in a band of 100 Khz~15 Mhz including a wireless charging band and an NFC antenna band. The second magnetic substance 1432 may be made of a material having high magnetic permeability and a low loss tangent in a band of 10 Khz~200 Khz. For example, the first magnetic substance 1431 may include a magnetic substance including fine crystals. The second magnetic substance 1432 may include a magnetic substrate having amorphous crystals. The material of the second magnetic substance 1432 may be higher in magnetic permeability than the first magnetic substance 1431.

Only the first magnetic substance 1431 is disposed in the edge region 1401*b*, and the first magnetic substance 1431 and the second magnetic substance 1432 are disposed in the groove region 1401*a*, so the magnetic substance 1430 disposed in the region in which the first wireless charging coil 1410 is disposed may be thicker than the magnetic substance 1430 disposed in the region in which the first NFC coil is disposed.

According to various example embodiments, in the electronic device, at least one flexible printed circuit board that is disposed around the battery may be disposed between the battery and a first support member to secure a mounting space for the battery. It may be possible to remove a portion of the lower end portion of the pattern forming an antenna (e.g., the antenna module 501 shown in FIG. 5) or it may be possible to make the thicknesses of the patterns of an antenna modules disposed on both sides from a base in the antenna module different. According to various example embodiments, it is possible to remove a portion of the magnetic substance or the heat dissipater disposed under the patterns of the antenna modules. According to various example embodiments, it is possible to make the characteristics or the thicknesses including a plurality of layers disposed at the lower end portions of the patterns different.

According to various example embodiments, it is possible to secure a mounting space for the battery and the flexible printed circuit board using the structure described above. The structures described above may be combined with each other rather than being limited to the embodiments described with reference to the drawings. For example, it is possible to remove portions of the lower ends of patterns forming an antenna (e.g., the antenna module 501 shown in FIG. 5) and it is possible to make the thicknesses of the antenna modules disposed on both sides from the base in the antenna module different. Further, it is possible to remove portions of the lower end portions of the patterns forming the antenna and to remove a portion of the magnetic substance or the heat dissipater disposed under the patterns of the antenna module. Embodiments may be considered by combining the structures described above in various ways.

The electronic devices according to various example embodiments described above may include: a housing having a first surface and a second surface disposed to face the first surface and forming an internal space; a battery disposed adjacent to the second surface of the housing; and an antenna module comprising at least one coil disposed to face the first surface on the battery. The antenna module may include: a base; a first wireless charging coil disposed on a surface of the base; a first NFC coil spaced apart from the first wireless charging coil on a surface of the base and disposed outside the first wireless charging coil; a second wireless charging coil disposed at a position corresponding to the first wireless charging coil on an other surface of the base; a second NFC coil disposed at a position corresponding to the first NFC coil on the other surface of the base and surrounding a partial region of the second wireless charging coil; and a shield sheet disposed under the second wireless charging coil and the second NFC coil. The antenna module has a first region in which the second NFC coil and the second wireless charging coil are disposed and a second region corresponding to the other region, and the shield sheet may be formed to have different thicknesses in the first region and the second region.

In various example embodiments, a mounting space for a flexible printed circuit board may be formed in the second region. In various example embodiments, the second region may correspond to at least one edge of the antenna module.

In various example embodiments, the height of the shield sheet corresponding to the first region may be larger than the height of the shield sheet corresponding to the second region with respect to the battery. In various example embodiments, the shield sheet may be formed in a plurality of layers. In various example embodiments, the shield sheet may be thicker in the first region than in the second region. In various example embodiments, the shield sheet may include a first shield layer disposed in the first region and the second region and a second shield layer disposed on a surface of the shield layer in the first region, and the first shield layer and the second shield layer may be formed in at least two or more layers. In various example embodiments, the first shield layer may have a first bending portion facing the base on at least one edge of the first region and a second bending portion extending along the boundary between the base and the flexible printed circuit board at the joint between the base and the first bending portion. In various example embodiments, the magnetic permeability of the first shield layer and the second shield layer may be different. In various example embodiments, the first shield layer may include a material that can perform electromagnetic action in a band of 100 Khz 15 Mhz, and the second shield layer may include a material that can perform electromagnetic action in a band of 10 Khz~200 Khz. In various embodiments, the first shield layer may be thicker than the second shield layer.

In various example embodiments, the first wireless charging coil may be thinner than the second wireless charging coil.

In various example embodiments, the electronic devices may further include a heat dissipation member including a heat dissipating material disposed in a region corresponding to the second wireless charging coil, and facing the second surface.

The electronic devices according to various example embodiments described above may include: a housing having an internal space; a battery disposed in the housing; and an antenna module comprising at least one coil disposed on the battery. The antenna module may have a first region having a center portion and a second region corresponding to the edge of the antenna module. The first region and the second region may be formed at different heights from the battery. The antenna module may include: a first wireless charging coil disposed on a surface of a base of the antenna module in the first region; a second wireless charging coil disposed on an other surface; and a first NFC coil disposed outside the first wireless charging coil on a surface of the base in the second region.

In various example embodiments, the antenna module may include a first shield layer in contact with the second wireless charging coil in the first region and a second shield layer in contact with the first shield layer, in which the first shield layer and the second shield layer each may be at least two pieces. In various example embodiments, the antenna module may have a first boundary separating the first region and the second region, and a second boundary facing the first boundary, in which the first shield layer may have a first extension extending from the first boundary and a second extension extending from the second boundary, and the second shield layer may have a third extension extending only from the second boundary.

In various example embodiments, the antenna module may include a second NFC coil disposed outside a portion of the second wireless charging coil and disposed only between the second extension and the base.

In various example embodiments, the area of the first wireless charging coil may be larger than the area of the second wireless charging coil.

In various example embodiments, the antenna may include an NFC coil shield sheet disposed on a surface of the base in the second region.

In various example embodiments, the first shield layer may include a material that can perform electromagnetic action in a band of 100 Khz~15 Mhz, and the second shield layer may include a material that can perform electromagnetic action in a band of 10 Khz~200 Khz.

The various example embodiments of the disclosure disclosed in the disclosure and the drawings are only examples, and do not limit the scope of the disclosure. Therefore, in addition to the embodiments disclosed herein, the scope of the various embodiments of the disclosure should be understood to include all modifications or modified forms drawn based on the disclosure.

What is claimed is:

1. An electronic device comprising:
a housing having a first surface and a second surface disposed to face the first surface and defining an internal space;
a battery disposed adjacent to the second surface of the housing; and
an antenna module disposed on the battery to face the first surface,
wherein the antenna module includes:
a base;
a first wireless charging coil disposed on a first surface of the base;
a first near-field communication (NFC) coil, spaced apart from the first wireless charging coil, disposed on the first surface of the base and disposed outside the first wireless charging coil;
a second wireless charging coil disposed on a second surface of the base at a position corresponding to the first wireless charging coil;
a second NFC coil disposed on the second surface of the base at a position corresponding to the first NFC coil and surrounding only a partial region of the second wireless charging coil; and
a shield sheet disposed under the second wireless charging coil and the second NFC coil, and
wherein the antenna module includes a first region in which the second NFC coil and the second wireless charging coil are disposed and a second region different from the first region, and the shield sheet has different thicknesses in the first region and the second region.

2. The electronic device of claim 1, wherein the second region includes a mounting space for a flexible printed circuit board.

3. The electronic device of claim 2, wherein the second region corresponds to at least one edge of the antenna module.

4. The electronic device of claim 1, wherein a height of the shield sheet corresponding to the first region is greater than a height of the shield sheet corresponding to the second region with respect to the battery.

5. The electronic device of claim 4, wherein the shield sheet comprises a plurality of layers.

6. The electronic device of claim 5, wherein the shield sheet comprises a first shield layer disposed in the first region and the second region and a second shield layer disposed on a surface of the shield layer in the first region, and the first shield layer and the second shield layer include at least two or more layers.

7. The electronic device of claim 6, wherein the first shield layer includes a first bending portion facing the base on at least one edge of the first region and a second bending portion extending along a boundary between the base and a flexible printed circuit board mounted in a mounting space of the second region at a joint between the base and the first bending portion.

8. The electronic device of claim 7, wherein a magnetic permeability of the first shield layer is different from a magnetic permeability of the second shield layer.

9. The electronic device of claim 8, wherein the first shield layer includes a material capable of performing electromagnetic action in a band of 100 Khz 15 Mhz, and the second shield layer includes a material capable of performing electromagnetic action in a band of 10 Khz~200 Khz.

10. The electronic device of claim 8, wherein the first shield layer has a thickness greater than a thickness of the second shield layer.

11. The electronic device of claim 4, wherein the shield sheet has a thickness in the first region greater than a thickness in the second region.

12. The electronic device of claim 1, wherein the first wireless charging coil is thinner than the second wireless charging coil.

13. The electronic device of claim 1, further comprising a heat dissipation member comprising a heat dissipating material disposed in a region corresponding to the second wireless charging coil, and facing the second surface.

14. An electronic device comprising:
a housing including an internal space;
a battery disposed in the housing; and
an antenna module comprising at least one coil disposed on the battery,
wherein the antenna module includes:
a first region having a center portion and a second region corresponding to an edge of the antenna module;
a first wireless charging coil disposed on a first surface of a base of the antenna module in the first region;
a second wireless charging coil disposed on a second surface of the base;
a first near-field communication (NFC) coil disposed outside the first wireless charging coil on the first surface of the base in the first region and in the second region; and
a second NFC coil disposed on the second surface of the base in the first region, but not in the second region,
wherein the antenna module further includes a first shield layer in contact with the second wireless charging coil in the first region and a second shield layer in contact with the first shield layer, and
wherein the first shield layer and the second shield layer each includes at least two pieces.

15. The electronic device of claim 14, wherein an area of the first wireless charging coil is greater than an area of the second wireless charging coil.

16. The electronic device of claim 14, wherein the antenna includes an NFC coil shield sheet disposed on a surface of the base in the second region.

17. The electronic device of claim 14, wherein the antenna module includes a first boundary separating the first region and the second region, and a second boundary facing the first boundary,
the first shield layer includes a first extension extending from the first boundary and a second extension extending from the second boundary, and
the second shield layer includes a third extension extending from the second boundary.

18. The electronic device of claim 17, wherein the second NFC coil is disposed outside a portion of the second wireless charging coil and disposed between the second extension and the base.

19. The electronic device of claim 14, wherein the first shield layer includes a material capable of performing electromagnetic action in a band of 100 Khz~15 Mhz, and the second shield layer includes a material capable of performing electromagnetic action in a band of 10 Khz~200 Khz.

* * * * *